(12) United States Patent
Yoo et al.

(10) Patent No.: US 9,941,259 B2
(45) Date of Patent: Apr. 10, 2018

(54) LED MODULE AND METHOD FOR FABRICATING THE SAME

(71) Applicant: LUMENS CO., LTD., Yongin-si, Gyeonggi-do (KR)

(72) Inventors: Taekyung Yoo, Yongin-si (KR); Daewon Kim, Yongin-si (KR); Jinmo Kim, Yongin-si (KR); Jinwon Choi, Yongin-si (KR); Jimin Her, Yongin-si (KR); Younghwan Shin, Yongin-si (KR); Sol Han, Yongin-si (KR); Kyujin Lee, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/793,030

(22) Filed: Oct. 25, 2017

(65) Prior Publication Data

US 2018/0068986 A1    Mar. 8, 2018

Related U.S. Application Data

(62) Division of application No. 15/558,192, filed as application No. PCT/KR2017/008269 on Aug. 1, 2017.

(30) Foreign Application Priority Data

Aug. 11, 2016  (KR) .......................... 10-2016-0102239
Nov. 24, 2016  (KR) .......................... 10-2016-0157045
(Continued)

(51) Int. Cl.
H01L 27/32    (2006.01)
H01L 25/075   (2006.01)
(Continued)

(52) U.S. Cl.
CPC ...... H01L 25/0753 (2013.01); H01L 21/6836 (2013.01); H01L 24/81 (2013.01);
(Continued)

(58) Field of Classification Search
CPC ......... H01L 2924/0002; H01L 2924/00; H01L 2251/5338; H01L 23/4985; H01L 27/3244;
(Continued)

(56) References Cited

U.S. PATENT DOCUMENTS

2008/0218369 A1* 9/2008 Krans .................. A47G 9/1045
                                                    340/691.1
2009/0219225 A1* 9/2009 Cope ......................... G09F 9/30
                                                    345/55
(Continued)

FOREIGN PATENT DOCUMENTS

JP    H10163536 A    6/1998
JP    H11161197 A    6/1999
(Continued)

OTHER PUBLICATIONS

Office Action (Notice of Preliminary Rejection) dated Feb. 14, 2017 in Japanese Patent Application No. 2016-251519, 3 pgs.
(Continued)

*Primary Examiner* — Jonathan Han
(74) *Attorney, Agent, or Firm* — Mei & Mark LLP

(57) ABSTRACT

Disclosed is a method for fabricating an LED module. The method includes: constructing a chip-on-carrier including a chip retainer having a horizontal bonding plane and a plurality of LED chips in which electrode pads are bonded to the bonding plane of the chip retainer; and transferring the plurality of LED chips in a predetermined arrangement from the chip retainer to a substrate by transfer printing. The transfer printing includes: primarily section-wise exposing a
(Continued)

transfer tape to reduce the adhesive strength of the transfer tape such that bonding areas are formed at predetermined intervals on the transfer tape; and pressurizing the transfer tape against the LED chips on the chip retainer to attach the LED chips to the corresponding bonding areas of the transfer tape and detaching the electrode pads of the LED chips from the chip retainer to pick up the chips.

10 Claims, 16 Drawing Sheets

(30) Foreign Application Priority Data

| | | |
|---|---|---|
| Mar. 10, 2017 | (KR) | ........................ 10-2017-0030395 |
| Mar. 16, 2017 | (KR) | ........................ 10-2017-0032900 |
| Mar. 16, 2017 | (KR) | ........................ 10-2017-0032955 |

(51) Int. Cl.

| | |
|---|---|
| *H01L 33/60* | (2010.01) |
| *H01L 23/00* | (2006.01) |
| *H01L 33/00* | (2010.01) |
| *H01L 21/683* | (2006.01) |
| *H01L 33/62* | (2010.01) |
| *H01L 33/30* | (2010.01) |
| *H01L 33/32* | (2010.01) |
| *H01L 33/06* | (2010.01) |
| *H01L 33/08* | (2010.01) |

(52) U.S. Cl.
CPC ........ *H01L 33/007* (2013.01); *H01L 33/0079* (2013.01); *H01L 33/60* (2013.01); *H01L 33/62* (2013.01); *H01L 33/06* (2013.01); *H01L 33/08* (2013.01); *H01L 33/30* (2013.01); *H01L 33/32* (2013.01); *H01L 2221/68322* (2013.01); *H01L 2224/81203* (2013.01); *H01L 2224/81815* (2013.01); *H01L 2924/12041* (2013.01); *H01L 2933/0066* (2013.01)

(58) Field of Classification Search
CPC .............. H01L 25/167; H01L 27/3293; G09G 2380/02; G09G 2300/0426
USPC ......... 313/511; 345/1.1, 1.3, 55; 257/59, 72; 349/150
See application file for complete search history.

(56) References Cited

U.S. PATENT DOCUMENTS

| | | | |
|---|---|---|---|
| 2015/0102320 A1* | 4/2015 | Jung | ................... H01L 27/3218 257/40 |
| 2015/0109547 A1* | 4/2015 | Kim | ................. G02F 1/133305 349/12 |
| 2015/0138214 A1* | 5/2015 | Roh | ................... G02B 27/0101 345/520 |

FOREIGN PATENT DOCUMENTS

| | | |
|---|---|---|
| JP | 2003005674 A | 1/2003 |
| JP | 2003007986 A | 1/2003 |
| JP | 2003332523 A | 11/2003 |
| JP | WO2003063312 A1 | 5/2005 |
| JP | 2008080396 A | 4/2008 |

OTHER PUBLICATIONS

Office Action (Notice of Allowance) dated May 30, 2017 in Japanese Patent Application No. 2016-251519, 2 pgs.

\* cited by examiner

LED MODULE AND METHOD FOR FABRICATING THE SAME

CROSS-REFERENCE TO RELATED PATENT APPLICATION(S)

This application is a division of U.S. patent application Ser. No. 15/558,192 filed Sep. 13, 2017, the U.S. National Stage entry of PCT/KR2017/008269, filed Aug. 1, 2017, which claims priority to Korean Patent Application No. 10-2016-0102239, filed Aug. 11, 2016, Korean Patent Application No. 10-2016-0157045, filed Nov. 24, 2016, Korean Patent Application No. 10-2017-0030395, filed on Mar. 10, 2017, Korean Patent Application No. 10-2017-0032900, filed Mar. 16, 2017, and Korean Patent Application No. 10-2017-0032955, filed Mar. 16, 2017, the entire contents of which are incorporated herein by reference in their entirety.

TECHNICAL FIELD

The present invention relates to an LED module and a method for fabricating the same. More specifically, the present invention relates to a method for fabricating an LED module by using transfer printing and flip bonding.

BACKGROUND ART

Full-color LED displays in which LEDs emitting light at different wavelengths are grouped into pixels have been proposed as potential replacements for displays using LEDs as backlight light sources. Each pixel consists of red, green, and blue LEDs or red, green, blue, and white LEDs. In such an LED display, red, green, and blue LEDs are fabricated in packages and are mounted on a substrate. However, due to the large distances between the constituent LEDs of each pixel, high-quality resolution is difficult to obtain. Pixels consisting of packages of LEDs are difficult to apply to micro-LED displays that have recently received much attention. LED pixel units have also been proposed in which red LEDs, green LEDs, and blue LEDs constituting one pixel are mounted in one package. In such an LED pixel unit, the distance between the adjacent LEDs (i.e. sub-pixels) in one pixel is small but the distance between the adjacent pixels is difficult to reduce. Further, light interference may occur between the red, green, and blue LEDs.

Thus, for the purpose of reducing the distance between pixels, the present inventors have attempted to fabricate an LED display module in which groups of LED chips, each of which includes red LED, green LED, and blue LED chips, are arrayed in a matrix on a PCB substrate. It is, however, difficult to mount the LED chips at predetermined heights and intervals on the micrometer-sized substrate. Different heights and/or intervals between the LED chips mounted on the substrate deteriorate the color reproducibility of the LED display module. Wire bonding is necessary for electrical connection between electrode pads and the LED chips on the substrate but it takes at least tens to hundreds of hours to manufacture one product. Particularly, in the course of mounting tens to hundreds of LED chips on the substrate, some of the LED chips are not accurately located at desired positions, making it impossible to achieve a designed light emitting pattern and causing serious color deviation. Particularly, techniques for fabricating LED display modules including arraying micro-LEDs with a size of several to several hundreds of micrometers on an active matrix (AM) substrate are currently in use but are difficult to apply to the fabrication of display modules with high precision and good quality based on conventional chip mounting technology.

SUMMARY

In this connection, a technique for transferring LED chips arrayed at given positions to a substrate by total transfer printing can provide a solution to the problems of the prior art. However, although LED chips together with the overlying electrode pads are transferred to and arrayed on a substrate by total transfer printing, an additional process, such as wire bonding, is required. The increased number of processing steps leads to an increase in fabrication cost. Further, the alignment of LED chips is disordered, causing considerable deterioration of quality. In contrast, transfer printing of flip-bonded LED chips including downwardly arranged electrode pads to a substrate can avoid the need of an additional process, such as wire bonding, and as a result, the alignment of the LED chips can be prevented from being disordered. In addition, transfer printing enables an array of selected LED chips with a size of tens to hundreds of micrometers in a desired arrangement.

Therefore, the present invention is directed to providing a method for fabricating an LED module by transferring LED chips from a chip retainer adapted to retain the LED chips in a predetermined arrangement without being disordered to a substrate by transfer printing and subsequent flip bonding of the LED chips on the substrate.

Technical Solution

A method for fabricating an LED module according to one aspect of the present invention includes: constructing a chip-on-carrier including a chip retainer having a horizontal bonding plane and a plurality of LED chips in which electrode pads are bonded to the bonding plane of the chip retainer, and transferring the plurality of LED chips in a predetermined arrangement from the chip retainer to a substrate by transfer printing, wherein the transfer printing includes: primarily section-wise exposing a transfer tape to reduce the adhesive strength of the transfer tape such that bonding areas are formed at predetermined intervals on the transfer tape; and pressurizing the transfer tape against the LED chips on the chip retainer to attach the LED chips to the corresponding bonding areas of the transfer tape and detaching the electrode pads of the LED chips from the chip retainer to pick up the chips.

According to one embodiment, the primary exposure includes exposing the transfer tape through a photomask formed with a plurality of light-transmitting windows.

According to one embodiment, the method further includes, after the chip pick-up, secondarily exposing the transfer tape attached with the LED chips to weaken the adhesive strength of the transfer tape as a whole and placing the plurality of LED chips from the transfer tape whose adhesive strength is weakened as a whole on the substrate.

According to one embodiment, the chip pick-up includes pressurizing the transfer tape against the LED chips bonded onto the chip retainer with a pick-up roller rolling in one direction.

According to one embodiment, the placing includes pressurizing the LED chips attached to the transfer tape against the substrate with a placing roller so that the electrode pads of the LED chips are attached to pairs of bumps formed on the substrate.

According to one embodiment, the adhesive strength of the transfer tape during the placing is lower than the adhesive strength of an adhesive loaded on the pairs of bumps.

According to one embodiment, the chip-on-carrier construction includes preparing a chip retainer having a horizontal bonding plane, preparing a plurality of LED chips, and attaching the LED chips onto the bonding plane to form one or more LED chip arrays wherein the preparation of a plurality of LED chips includes preparing a plurality of LED chips including downwardly extending n-type electrode pads and p-type electrode pads and the chip attachment includes directly bonding the n-type electrode pads and the p-type electrode pads to the bonding plane.

According to one embodiment, the chip attachment includes attaching the plurality of LED chips to the bonding plane such that the pitch in the LED chip arrays on the chip retainer is one-nth (where n is a natural number equal to or greater than 1) of that in the LED chip arrays transferred to the substrate by the transfer printing, the pitch representing the horizontal distance between the center of one LED chip and the center of the adjacent LED chip.

An LED module according to a further aspect of the present invention includes: a plurality of arrayed LED chips transferred from an external chip retainer, each of the LED chips having electrode pads at one side thereof and a plane attached to a transfer tape at the other side thereof; and a substrate having a plurality of bumps flip-bonded to the electrode pads, wherein the transfer tape is divided into exposed areas and unexposed areas by primary light irradiated from the outside onto the side opposite to the LED chips and the LED chips are bonded to and picked up on the unexposed areas.

According to one embodiment, the transfer tape loses its adhesive strength in the bonding areas by secondary light irradiated from the outside onto the side opposite to the LED chips and is detached from the LED chips.

According to one embodiment, the bonding areas of the transfer tape are protected from the primary light irradiated from the outside onto the side opposite to the LED chips through a photomask.

According to one embodiment, the LED chips are picked up by a roller that rolls while pressurizing the transfer tape against the LED chips.

According to one embodiment, the LED chips are situated and aligned at desired positions on the substrate and are then detached from the transfer tape by the pressurization of the rolling roller.

According to one embodiment, the chip retainer includes a horizontal bonding plane and the electrode pads extending downwardly at one side of each of the LED chips are directly bonded to the chip retainer.

According to one embodiment, the plurality of LED chips have the same height from the bonding plane of the chip retainer.

According to one embodiment, the pitch in the LED chip arrays on the chip retainer is one-nth (where n is a natural number equal to or greater than 1) of that in the LED chip arrays transferred to the substrate, the pitch representing the horizontal distance between the center of one LED chip and the center of the adjacent LED chip.

According to one embodiment, the adhesive strength of the chip retainer is lower than the adhesive strength of the unexposed areas of the transfer tape and is higher than the adhesive strength of the exposed areas of the transfer tape.

According to one embodiment, the plurality of LED chips arrayed on the chip retainer consist of only one type of LED chip selected from red, green, and blue LED chips produced by the same process.

According to one embodiment, the plurality of LED chips arrayed on the chip retainer include red LED chips, green LED chips, and blue LED chips.

According to one embodiment, the chip retainer may be a flexible film.

Advantageous Effects

According to the present invention, the LED module can be fabricated by precisely aligning a plurality of LED chips on a substrate by transfer printing. According to the transfer printing, all or some LED chips arrayed at given positions are arrayed in a desired arrangement on a target substrate.

Other effects of the present invention will be better understood from the following description.

DETAILED DESCRIPTION

Best Mode

[Fabrication of First Type LED Module]

Figure 1:
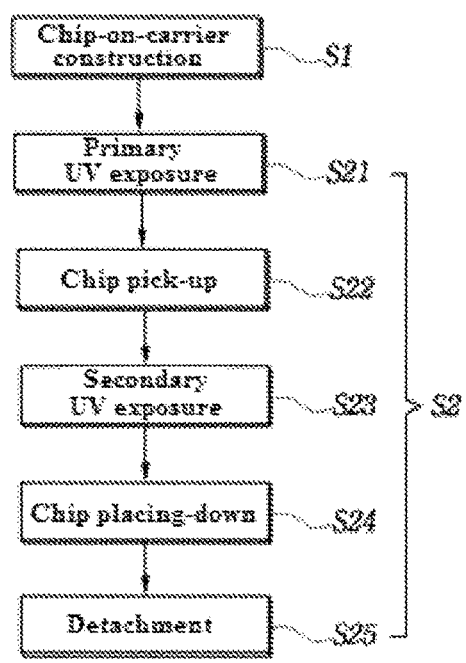
FIG. 1 is a flow chart for explaining a method for fabricating an LED module according to one embodiment of the present invention.
Figure 2:
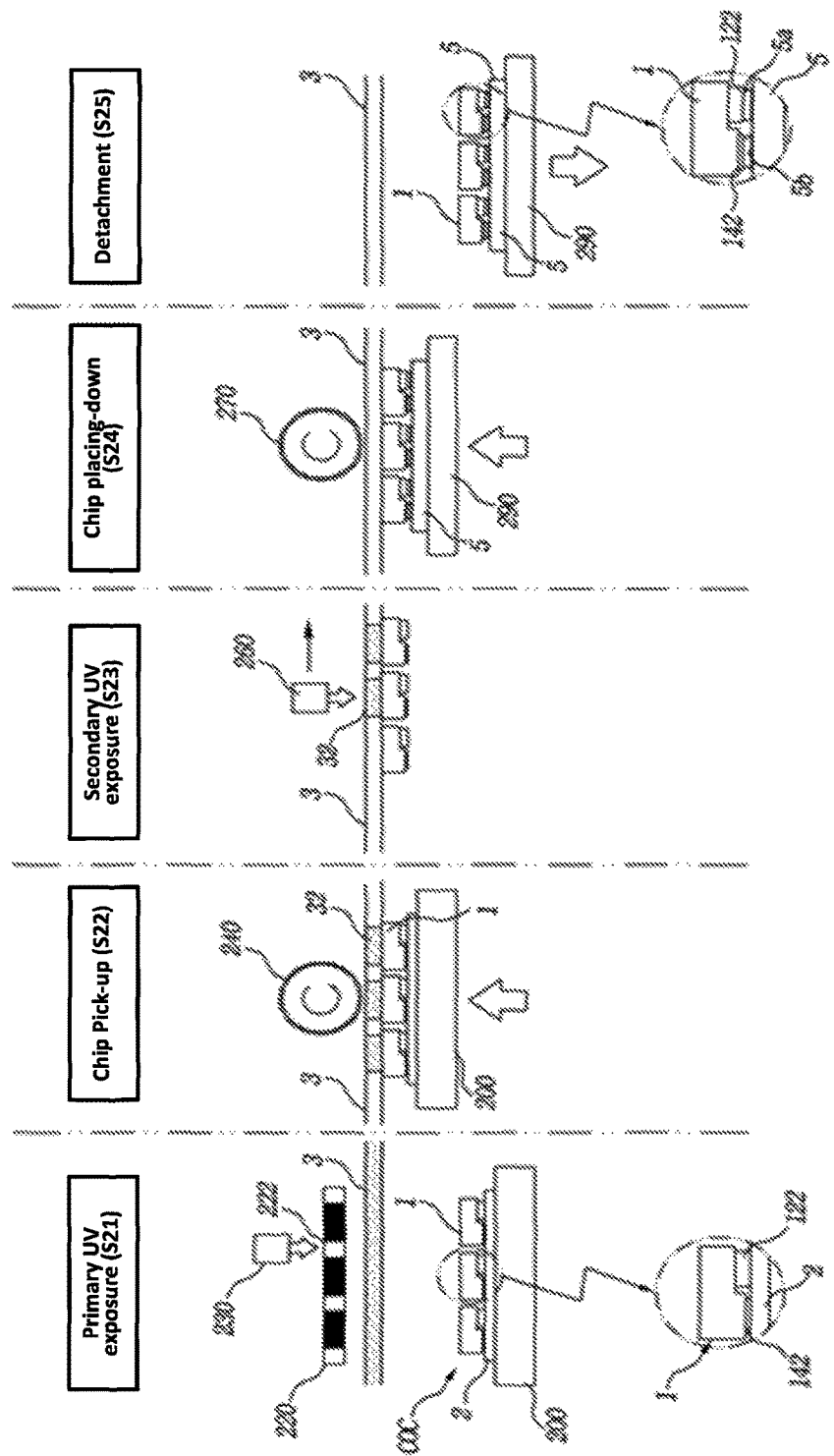
FIG. 2 illustrates a transfer printing process in a method for fabricating an LED module according to one embodiment of the present invention.

Referring to FIGS. 1 and 2, a method for fabricating an LED module according to one embodiment of the present invention includes constructing a chip-on-carrier including a chip retainer 2 having a horizontal bonding plane and a plurality of LED chips 1 bonded to the bonding plane of the chip retainer 2 (S1) and transferring the LED chips 1 in a predetermined arrangement from the chip retainer 2 to a substrate 5 by transfer printing (S2). In S1, a chip-on-carrier (COC) is constructed. The chip-on-carrier includes a plurality of LED chips including electrode pads 122 and 142 (i.e. n-type electrode pads 122 and p-type electrode pads 142) retained on the chip retainer 2. The pitch P between the LED chips 1 in the chip-on-carrier (COC) is one-nth (where n is a natural number equal to or greater than 1) of that between the LED chips in the arrays transferred to the substrate by the transfer printing. As used herein, there term "pitch" is defined as the horizontal distance between the center of one LED chip and the center of the adjacent LED chip.

S2 includes transfer printing the plurality of LED chips 1 attached onto the chip retainer 2 of the chip-on-carrier (COC) on a substrate 5.

S2 includes primarily section-wise exposing a transfer tape 3 to reduce the adhesive strength of the transfer tape such that bonding areas are formed at predetermined intervals on the transfer tape (S21), pressurizing the transfer tape 3 against the LED chips 1 on the chip-on-carrier COC to attach the LED chips 1 to the corresponding bonding areas 32 of the transfer tape 3 (chip pick-up, S22), secondarily exposing the transfer tape 3 to weaken the adhesive strength of the transfer tape 3 as a whole (S23), and pressurizing the LED chips 1 attached to the transfer tape 3 whose adhesive strength is weakened against the substrate 5 (placing down, S24). After S24, the transfer tape 3 is detached from the LED chips 1 (S25).

First, in S21, a photo mask 220 including a plurality of UV light-transmitting windows 222 is arranged. UV light from a first UV light source 230 is irradiated onto the transfer tape 3 through the UV light-transmitting windows 222. In other words, a transfer tape 3 is exposed to UV light passing through UV light-transmitting windows 222 from a first UV light source 230. This exposure weakens the adhesive strength of areas of the transfer tape 3 exposed to the UV light. Only areas other than the exposed areas whose adhesive strength is weakened are bonding areas 32, which are arranged at regular intervals.

Next, in S22, the transfer tape 3 is pressurized against the LED chips 1 preliminarily attached onto the chip retainer 2 with a pick-up roller 240 that rolls in one direction.

In S23, the transfer tape 3 carrying the LED chips 1 is exposed to UV light. The UV exposure weakens the adhesive strength of the bonding areas 32 of the transfer tape 3. The second UV light source 260 irradiates UV light onto the transfer tape 3 to weaken the adhesive strength of all areas (including the bonding areas 32 where the LED chips 1 are retained) of the transfer tape 3.

S24 includes pressurizing the LED chips 1 bonded to the transfer tape 3 whose adhesive strength is weakened against a substrate 5.

The adhesive strength of the transfer tape 3 after S23 is lower than that of an adhesive loaded on the pairs of bumps 5a and 5b. The placing roller 270 rolls and pressurizes the LED chips 1 attached to the transfer tape 3 against the substrate 5, more specifically the pairs of bumps 5a and 5b. As a result of the pressurization, the corresponding LED chips 1 are attached onto the substrate 5. The placing roller 270 may be provided with a flexible blanket on the outer circumference of a roller body coupled to a shaft. The provision of the blanket allows the LED chips 1 to be better placed down during rolling and can protect the LED chips 1 from damage caused by pressurization during rolling. A second stage 290 may ascend to help the placing roller 270 pressurize the LED chips. Next, the transfer tape 3 is detached from the LED chips 1 (S25). Then, the LED chips 1 placed down on the substrate 5 can be bonded onto the substrate by subsequent reflow soldering.

Figure 3:
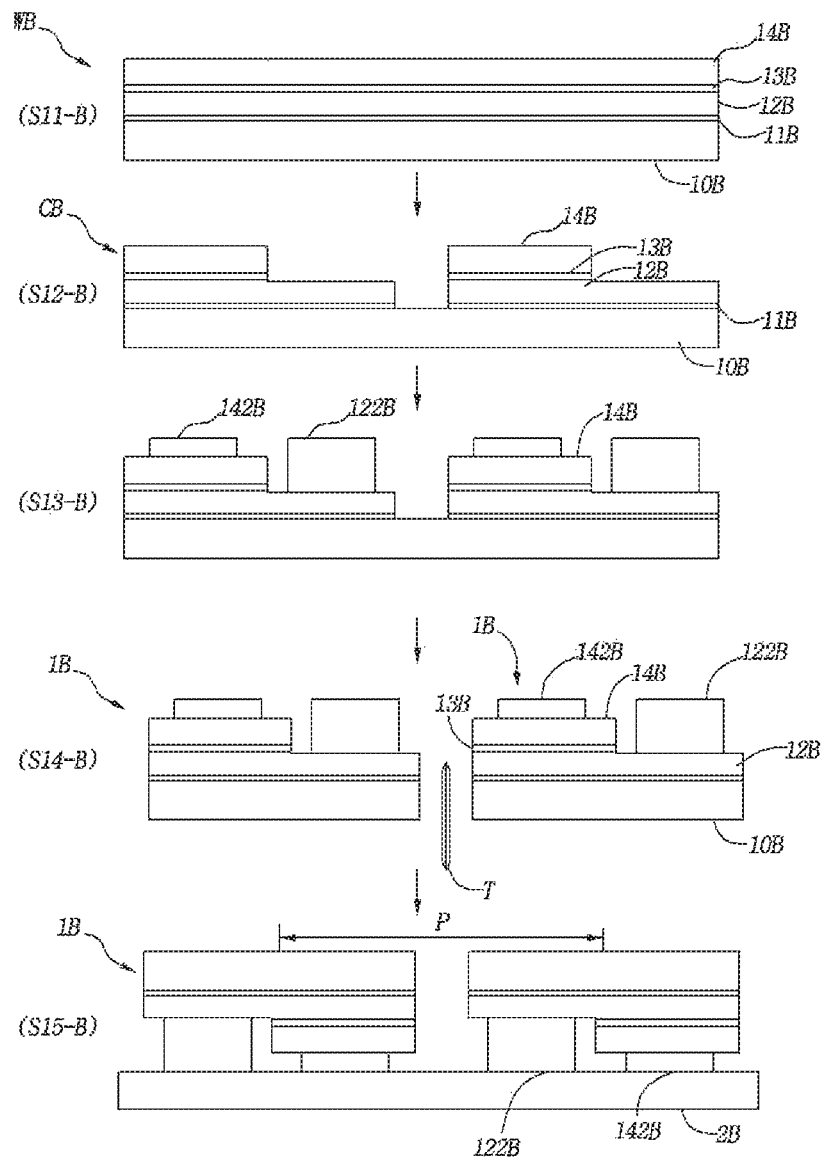
FIG. 3 illustrates a process for constructing a chip-on-carrier including blue LED chips in a method for fabricating an LED module according to one embodiment of the present invention.

Referring to FIG. 3, the process for constructing a chip-on-carrier including blue LED chips 1B includes: producing a blue LED wafer WB including a sapphire substrate 10B and a nitride gallium epilayer grown on the sapphire substrate 10B and including an n-type semiconductor layer 12B, an active layer 13B, and a p-type semiconductor layer 14B (S11-B); patterning the epilayer such that a plurality of blue light emitting cells CB including all exposed areas of the p-type semiconductor layer 14B and the n-type semiconductor layer 12B, which are stepped with each other, at the side opposite to the sapphire substrate 10B are arranged in a matrix (S12-B); forming p-type electrode pads 142B in the exposed area of the p-type semiconductor layer 14B and forming n-type electrode pads 122B in the exposed area of the n-type semiconductor layer 12B (S13-B); singulating the LED wafer WB into light emitting cell (CB) units to produce a plurality of blue LED chips 1B including the sapphire substrate 10B, the wafer layers 12B, 13B, and 14B on the sapphire substrate 10B, and the p-type electrode pads 142B and the n-type electrode pads 122B formed on the wafer layers 12B, 13B, and 14B opposite to the sapphire substrate 10B (S14-B); and inverting the plurality of blue LED chips 1B such that the p-type electrode pads 142B and the n-type electrode pads 122B are directed downward and attaching the blue LED chips to the adhesive chip retainer 2 such that the plurality of blue LED chips 1B are arranged in a matrix (S15-B). The adhesive strength of the chip retainer 2 is lower than that of the transfer tape 3 before and after UV exposure.

In S11-B, an epilayer grows such that an active layer 13B includes an $In_xGa(1-x)N$ well layer. The amount of In in the well layer is appropriately controlled to obtain blue LED chips 1B. In S12-B, a plurality of row valleys and a plurality of column valleys are formed in the epilayer by etching. As a result of the etching, a plurality of light emitting cells CB are formed, each of which includes an n-type semiconductor layer 12B, the active layer 13B, and a p-type semiconductor layer 14B on a sapphire substrate 10B or a lattice matching layer 11B thereon. Next, the p-type semiconductor layer 14B and the active layer 13B of each of the light emitting cells CB are partially etched to expose the n-type semiconductor layer 12B. In S13-B, p-type electrode pads 142B are formed in the exposed area of the p-type semiconductor layer 14B and n-type electrode pads 122B are formed in the exposed area of the n-type semiconductor layer 12B. The n-type electrode pads 122B and the p-type electrode pads 142B are formed to such thicknesses to compensate for the step height such that the height from the bottom of the sapphire substrate 10B to the upper surfaces of the n-type electrode pads 122B is equal to the distance from the bottom of the sapphire substrate 10B to the p-type electrode pads 142B. In S14-B, the blue LED wafer WB is singulated into the light emitting cell CB units using a suitable cutting tool T, such as a blade or saw, or a suitable laser to produce a plurality of blue LED chips 1B. Until this step, the n-type electrode pads 122B and the p-type electrode pads 142B are directed upward and the sapphire substrate 10B is directed downward. In S15-B, the plurality of blue LED chips 1B are inverted such that the n-type electrode pads 122B and the p-type electrode pads 142B are bonded to a horizontal bonding plane of a chip retainer 2B to attach the plurality of blue LED chips 1B onto the chip retainer 2B. Here, the upper surface of each of the LED chips 1 becomes a base plane of the sapphire substrate 10B and the heights of all LED chips 1 from the bonding plane of the chip retainer 2B are constant. All blue LED chips 1B of the chip-on-carrier thus produced are arranged in row and column arrays on the chip retainer 2B. The chip retainer 2B is preferably a flexible chip retaining film having a horizontal bonding plane. The pitch P between the blue LED chips 1B in a particular one-row array bonded to and retained on the horizontal bonding plane of the chip retainer 2B is determined as one-nth (where n is a natural number equal to or greater than 1) of that between the blue LED chips in a one-row array arrayed on a substrate by transfer printing. Herein, the pitch between the chips is defined as the horizontal distance between the center of one LED chip and the adjacent LED chip.

Figure 4:
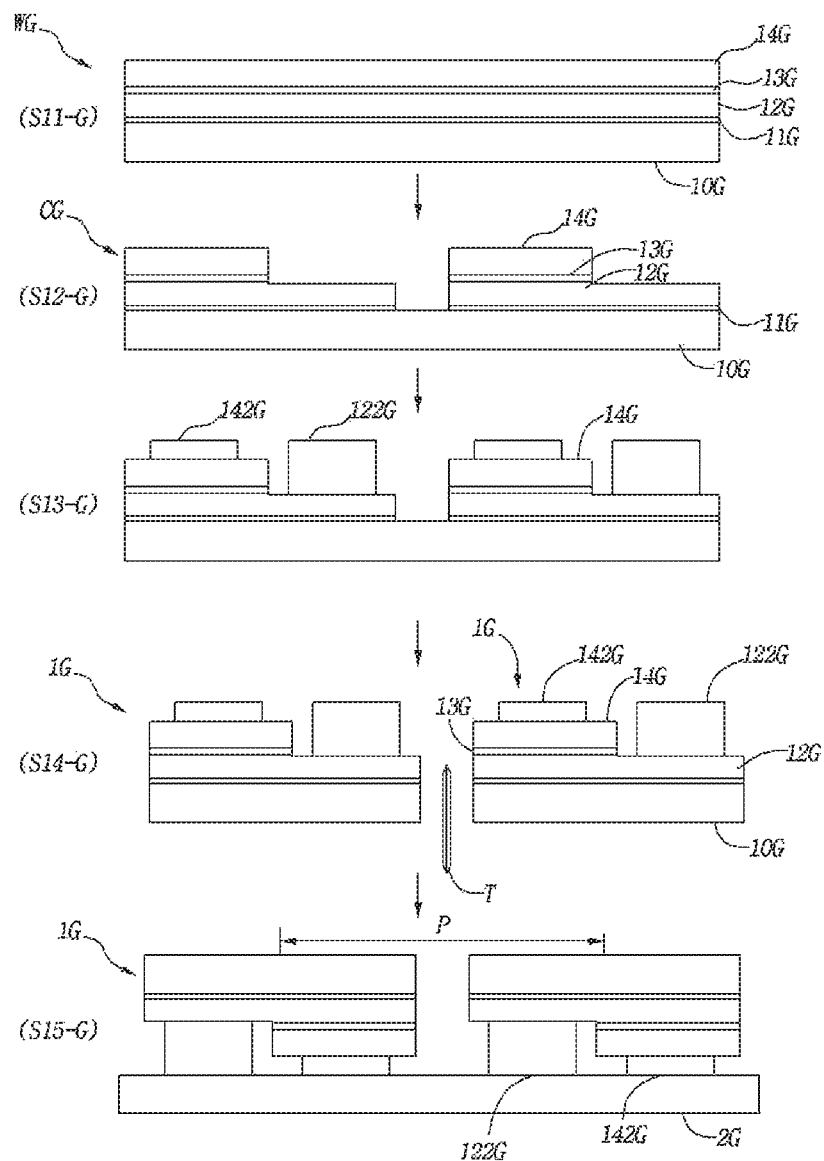
FIG. 4 illustrates a process for constructing a chip-on-carrier including green LED chips in a method for fabricating an LED module according to one embodiment of the present invention.

Referring to FIG. 4, the process for constructing a chip-on-carrier including green LED chips 1G includes: producing a green LED wafer WG including a sapphire substrate 10G and a nitride gallium epilayer grown on the sapphire substrate 10G and including an n-type semiconductor layer 12G, an active layer 13G, and a p-type semiconductor layer 14G (S11-G); patterning the epilayer such that a plurality of green light emitting cells CG including all exposed areas of the p-type semiconductor layer 14G and the n-type semiconductor layer 12G, which are stepped with each other, at the side opposite to the sapphire substrate 10G are arranged in a matrix (S12-G); forming p-type electrode pads 142G in the exposed area of the p-type semiconductor layer 14G and forming n-type electrode pads 122G in the exposed area of the n-type semiconductor layer 12G (S13-G); singulating the LED wafer WG into light emitting cell (CB) units to produce a plurality of green LED chips 10G including the sapphire substrate 10G, the wafer layers 12G, 13G, and 14G on the sapphire substrate 10G, and the p-type electrode pads 142G and the n-type electrode pads 122G formed on the wafer layers 12G, 13G, and 14G opposite to the sapphire substrate 10G (S14-G); and inverting the plurality of green LED chips 1G such that the p-type electrode pads 142G and the n-type electrode pads 122G are directed downward and attaching the green LED chips to the adhesive chip retainer 2 such that the plurality of green LED chips 1G are arranged in a matrix (S15-G).

In S11-G, an epilayer grows such that an active layer 13G includes an $In_xGa_{(1-x)}N$ well layer. The content of In is adjusted to a higher level to obtain the green LED chips 1G than that used to obtain the blue LED chips 1B.

In S12-G, a plurality of row valleys and a plurality of column valleys are formed in the epilayer by etching. As a result of the etching, a plurality of light emitting cells CG are formed, each of which includes an n-type semiconductor layer 12G, the active layer 13G, and a p-type semiconductor layer 14G on a sapphire substrate 10G or a lattice matching layer 11G thereon. Next, the p-type semiconductor layer 14G and the active layer 13G of each of the light emitting cells CG are partially etched to expose the n-type semiconductor layer 12G. In S13-G, p-type electrode pads 142G are formed in the exposed area of the p-type semiconductor layer 14G and n-type electrode pads 122G are formed in the exposed area of the n-type semiconductor layer 12G. The n-type electrode pads 122G and the p-type electrode pads 142G are formed to such thicknesses to compensate for the step height such that the height from the bottom of the sapphire substrate 10G to the upper surface of the n-type electrode pads 122G is equal to the distance from the bottom of the sapphire substrate 10G to the p-type electrode pads 142G. In S14-G, the green LED wafer WB is singulated into the light emitting cell CG units using a suitable cutting tool T, such as a blade or saw, or a suitable laser to produce a plurality of green LED chips 1G. Until this step, the n-type electrode pads 122G and the p-type electrode pads 142G are directed upward and the sapphire substrate 10G is directed downward. In S15-G, the plurality of green LED chips 1G are inverted such that the n-type electrode pads 122G and the p-type electrode pads 142G are bonded to a horizontal bonding plane of a chip retainer 2G to attach the plurality of green LED chips 1G onto the chip retainer 2G. Here, the upper surface of each of the green LED chips 1G becomes a base plane of the sapphire substrate 10G and the heights of all green LED chips 1G from the bonding plane of the chip retainer 2G are constant. All green LED chips 1G of the chip-on-carrier thus produced are arranged in row and column arrays on the chip retainer 2G. The chip retainer 2G is preferably a flexible chip retaining film having a horizontal bonding plane. The pitch P between the green LED chips 1G in a particular one-row array bonded to and retained on the horizontal bonding plane of the chip retainer 2G is determined as one-nth (where n is a natural number equal to or greater than 1) of that between the green LED chips in a one-row array arrayed on a substrate by transfer printing.

Figure 5:
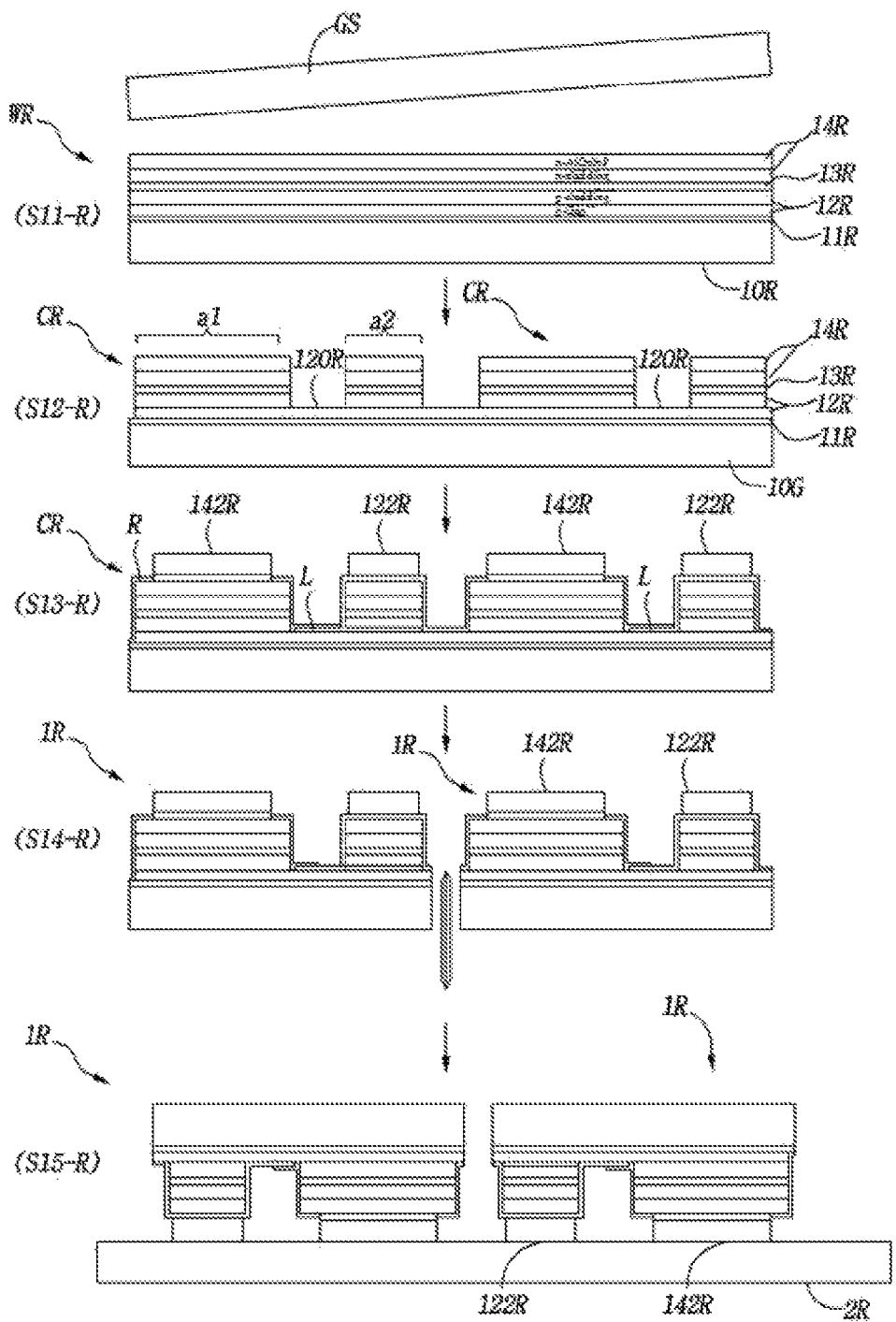
FIG. 5 illustrates a process for constructing a chip-on-carrier including red LED chips in a method for fabricating an LED module according to one embodiment of the present invention.

Referring to FIG. 5, the process for constructing a chip-on-carrier including red LED chips includes: producing a red LED wafer WR including a sapphire substrate 10R and an epilayer bonded onto the sapphire substrate 10R and including a p-type semiconductor layer 12R, an active layer 13R, and an n-type semiconductor layer 14R (S11-R); patterning the epilayer such that a plurality of red light emitting cells CR, each of which is divided into a first area a1 and a second area a2 by an exposed groove 120R on the p-type semiconductor layer, are arranged in a matrix (S12-R); forming n-type electrode pads 142R connected to the n-type semiconductor layer 14R on the n-type semiconductor layer 14R in the first area a1 and forming p-type electrode pads 122R electrically isolated from the n-type semiconductor layer 14R by an insulating layer R and connected to the an interconnection layer L extending from the exposed groove 120R on the n-type semiconductor layer 14R in the second area a2 (S13-R); singulating the red LED wafer WR into light emitting cell (CB) units to produce a plurality of red LED chips 1R including the sapphire substrate 10R, the wafer layers on the sapphire substrate, and the p-type electrode pads 122R and the n-type electrode pads 142R (S14-R); and inverting the plurality of red LED chips 1R such that the p-type electrode pads 122R and the n-type electrode pads 142R are directed downward and attaching the red LED chips to the adhesive chip retainer 2R such that the plurality of red LED chips 1R are arranged in a matrix (S15-R).

S11-R includes: growing an epilayer including an n-type semiconductor layer 14R, an active layer 13R, and a p-type semiconductor layer 12R on a GaAs substrate GS, the n-type semiconductor layer 14R including an n-AlGaInP layer and an n-cladding layer, the active layer 13R including MQW, and the p-type semiconductor layer 12R including a p-cladding layer and a p-GaP layer; bonding a sapphire substrate 10R as a support substrate to the p-type semiconductor layer 12R, a $SiO_2$ bonding layer 11R being interposed between the substrate and the p-type semiconductor layer, and detaching the GaAs substrate GS as a growth substrate from the n-type semiconductor layer 14R at the side opposite to the sapphire substrate.

In S12-R, a plurality of row valleys and a plurality of column valleys are formed in the epilayer by etching. As a result of the etching, a plurality of light emitting cells CR are formed, each of which includes the p-type semiconductor layer 12R, the active layer 13R, and the n-type semiconductor layer 14R on the sapphire substrate 10R or the bonding layer 11R thereon. Next, each light emitting cell CR is etched to a depth reaching the p-GaP layer of the p-type semiconductor layer 12R to form an exposed grooves 120R on the p-type semiconductor layer such that the upper area of the light emitting cell CR includes a first area a1 and a second area a2. In S13-R, n-type electrode pads 142R directly connected to the n-type semiconductor layer 14R are formed on the n-type semiconductor layer 14R in the first area a1 and p-type electrode pads 122R connected to the p-type semiconductor layer 12R through an interconnection layer L extending to the exposed groove 120R on the p-type semiconductor layer are formed on the n-type semiconductor layer 14R in the second area a2. The distance from the bottom of the sapphire substrate 10R to the n-type electrode pads 142R, i.e. the height of the n-type electrode pads 142R from the bonding plane, is the same as the distance from the bottom of the sapphire substrate 10R to the p-type electrode pads 122R, i.e. the height of the p-type electrode pads 122R from the bonding plane. In S14-R, the LED wafer WR is singulated into the light emitting cell CR units to produce a plurality of red LED chips 1R. Until this step, the n-type electrode pads 142R and the p-type electrode pads 122R are directed upward and the sapphire substrate 10R is directed downward. In S14-R, the plurality of red LED chips 1R are inverted such that the n-type electrode pads 142R and the p-type electrode pads 122R are bonded to the horizontal bonding plane of a chip retainer 2R to attach the plurality of red LED chips 1R onto the chip retainer 2R. Here, the upper surface of each of the LED chips 1R becomes a base plane of the sapphire substrate 10R and the heights of all LED chips 1R from the bonding plane of the chip retainer 2R are constant. All red LED chips 1R of the chip-on-carrier thus produced are arranged in row and column arrays on the chip retainer 2R.

Figure 6:
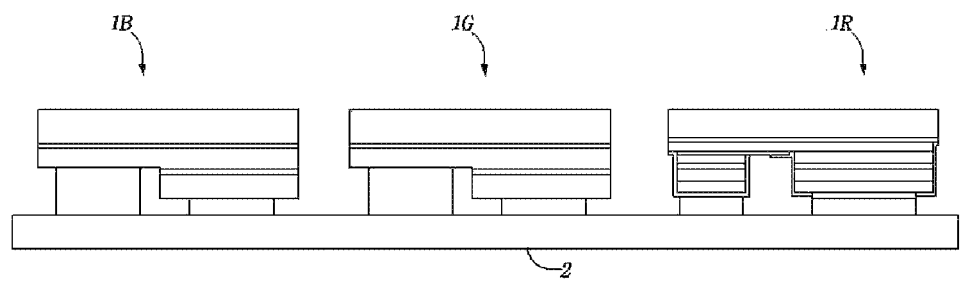
FIG. 6 illustrates a process for constructing a chip-on-carrier including red, green, and blue LED chips in accordance with an alternative embodiment of the present invention.

As illustrated in FIG. 6, a chip-on-carrier may also be considered in which a red LED chip 1R, a green LED chip 1G, and a blue LED chip 1B are sequentially attached onto a chip retainer 2. The chip-on-carrier can transfer the red LED chip 1R, the green LED chip 1G, and the blue LED chip 1B to a substrate all at one time by transfer printing.

[Fabrication of Second Type LED Module]

Figure 7:
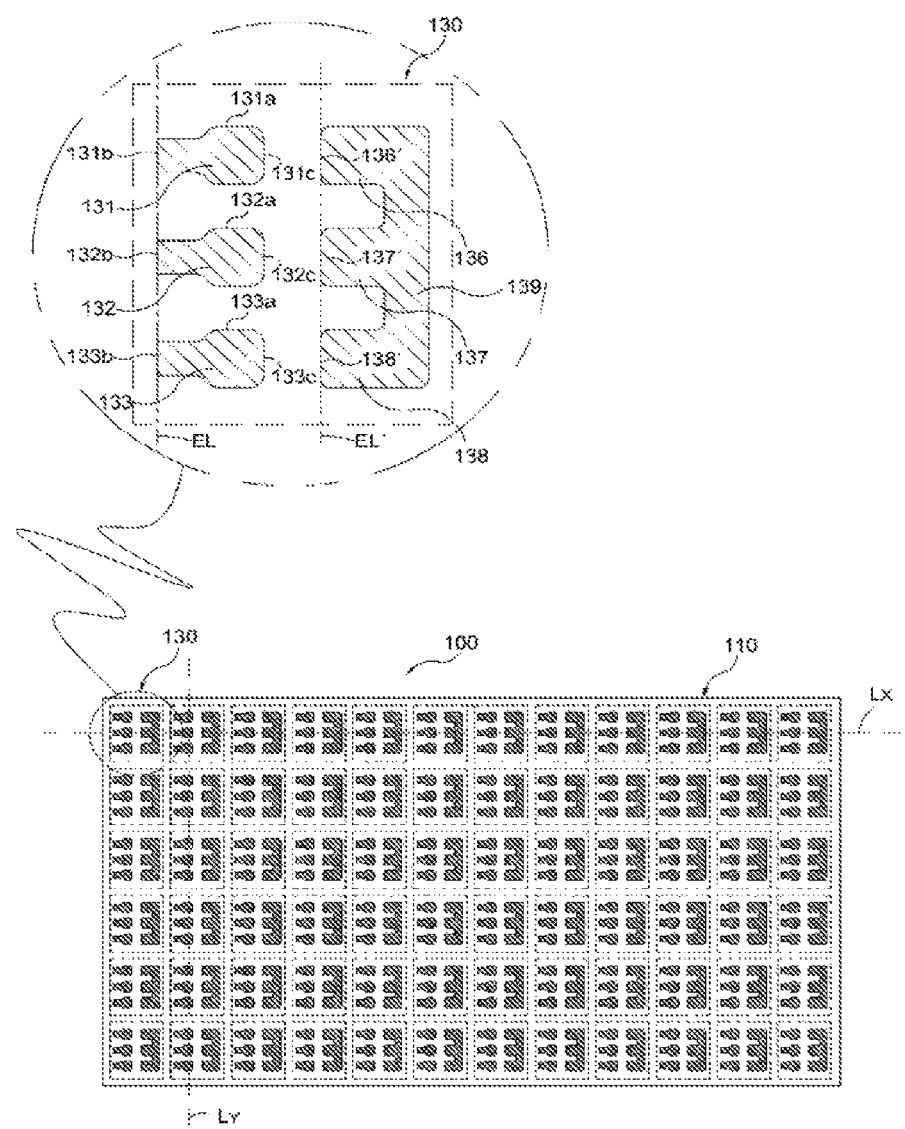
FIG. 7 is a plan view illustrating a substrate of a display module according to a further embodiment of the present invention and arrays of electrode patterns arranged in a matrix on the substrate.
Figure 8:
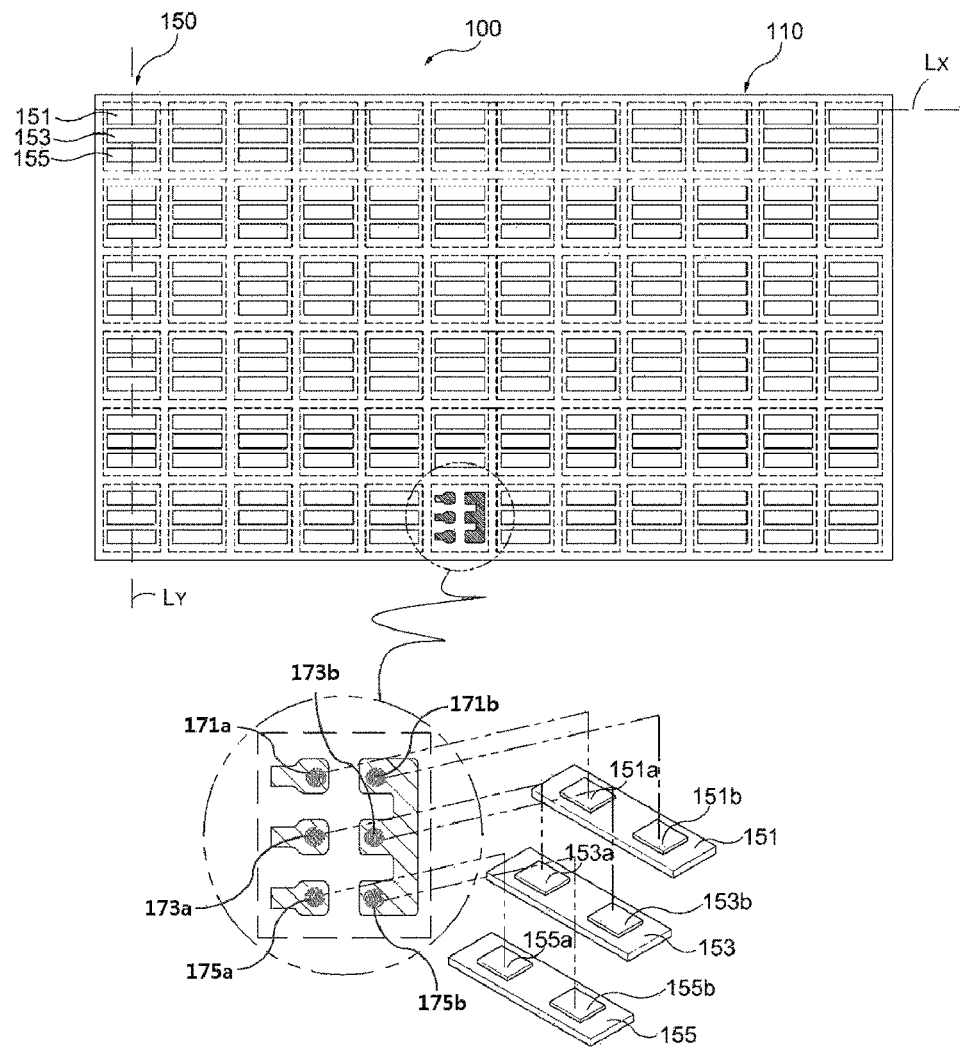
FIG. 8 is a plan view illustrating a display module including groups of LED chips arranged in a matrix on the electrode patterns illustrated in FIG. 7.
Figure 9:
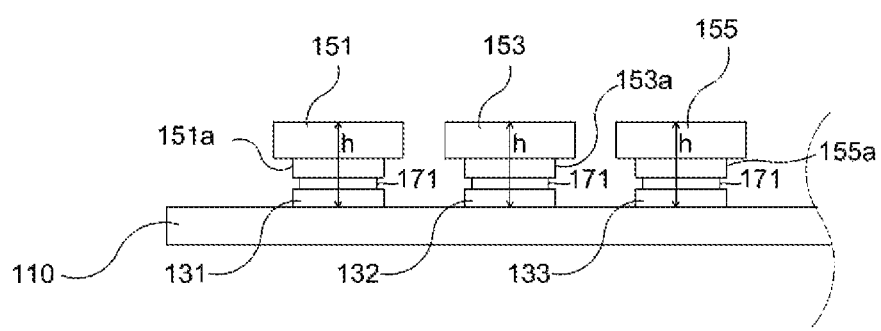
FIG. 9 is a cross-sectional view for explaining the groups of LED chips illustrated in FIG. 8.

Referring to FIGS. 7 to 9, an LED module 100 according to one embodiment of the present invention includes a rectangular substrate 110, a plurality of electrode patterns 130 having a predetermined height arranged in a matrix on the substrate 110, and a plurality of groups of LED chips 150 arranged in a matrix on the substrate 110 so as to correspond to the electrode patterns 130.

The electrode patterns 130 are formed on the substrate 110 and LED chips 151, 153 or 155 are mounted thereon. When the substrate 110 is flat, the plurality of LED chips 151, 153 or 155 can be mounted to a predetermined height thereon. The type of the substrate 110 is not limited so long as it is flat. For example, the substrate 110 may be rigid or flexible. Specifically, the substrate 110 may be a rigid plastic, ceramic or glass substrate or a flexible substrate such as an FPCB.

As mentioned above, the plurality of electrode patterns 130 are disposed in a matrix on the substrate 110 and have the same height as a whole. For example, the plurality of electrode patterns 130 having a predetermined height may be formed by partially removing a conductive metal film formed to a predetermined thickness on one flat surface of the substrate 110 by etching or forming a conductive metal film having a predetermined pattern to a predetermined height on one flat surface of the substrate 110 through a mask.

The plurality of electrode patterns 130 are arranged in a matrix with rows and columns in the widthwise and lengthwise directions, respectively. In the description of this embodiment, the widthwise and lengthwise directions are defined as directions parallel to line Lx and Ly in FIGS. 7 and 8, respectively.

Each of the electrode patterns 130 includes a common electrode pad 139 aligned to a first end line EL' parallel to the lengthwise direction of the matrix, and a first individual electrode pad 131, a second individual electrode pad 132, and a third individual electrode pad 133 aligned to a second end line EL parallel to the first end line EL' and located between the first end line EL' and the second end line EL.

The first individual electrode pad 131, the second individual electrode pad 132, and the third individual electrode pad 133 are individually connected to an input power source (not illustrated) in a finished electric circuit and enable independent control of LED chips, which will be explained in detail below.

The common electrode pad 139 includes two recesses depressed in a substantially rectangular shape inwardly from the first end line EL' and three branches, i.e. a first branch 136, a second branch 137, and a third branch 138, whose shapes are defined by the two recesses. Each of the first branch 136, the second branch 137, and the third branch 138 defines an area where a bonding bump formed at one side of an LED chip is bonded and contributes to the prevention of shorting caused by undesired distortion or slipping of the bonding bump upon flip-chip bonding of the LED chip.

The first individual electrode pad 131, the second individual electrode pad 132, and the third individual electrode pad 133 are disposed in parallel at uniform intervals such that LED chips emitting light at different wavelengths, i.e. a first LED chip 151, a second LED chip 153, and a third LED chip 155, are arrayed in parallel at uniform intervals, which will be explained in detail below. Each of the first individual electrode pad 131, the second individual electrode pad 132, and the third individual electrode pad 133 defines an area where a bump is bonded. Each of the electrode pads is connected the corresponding LED chip through the bump.

The first individual electrode pad 131, the second individual electrode pad 132, and the third individual electrode pad 133 include ends 131*b*, 132*b*, and 133*b* coinciding with the second end line EL, opposite ends 131*c*, 132*c*, and 133*c* close to the common electrode pad 139, and lateral sides 131a, 132a, and 133a parallel to the widthwise direction, respectively. The first individual electrode pad 131, the second individual electrode pad 132, and the third individual electrode pad 133 include narrow portions formed at the ends 131b, 132b, and 133b and wide portions formed at the ends 131c, 132c, and 133b and having larger widths than the narrow portions, respectively. The positions where bumps are formed are limited to the wide portions.

The ends 131c, 132c, and 133c of the individual electrode pads 131, 132, and 133 are located parallel and close to ends 136', 137', and 138' of the branches 136, 137, and 138 of the common electrode pad 139 coinciding with the first end line EL', respectively.

As well illustrated in FIG. 8, each of the groups of LED chips 150 includes a first LED chip 151, a second LED chip 153, and a third LED chip 155 arrayed in a line along the lengthwise direction and emitting light at different wavelengths. In this embodiment, the first LED chip 151 may be a red LED chip that emits light of an approximately red wavelength band when power is applied thereto, the second LED chip 153 may be a green LED chip that emits light of a green wavelength band when power is applied thereto, and the third LED chip 155 may be a blue LED chip that emits light of a blue wavelength band when power is applied thereto.

The first LED chip 151 has a 1st first electrode 151a bonded to the first individual electrode pad 131 through a 1st first bump 171a and a 1st second electrode 151b bonded to the first branch 136 of the common electrode pad 139 through a 1st second bump 171b at the side facing the substrate 110.

The second LED chip 153 has a 2nd first electrode 153a bonded to the second individual electrode pad 132 through a 2nd first bump 173a and a 2nd second electrode 153b bonded to the second branch 137 of the common electrode pad 139 through a 2nd second bump 173b at the side facing the substrate 110.

The third LED chip 155 has a 3rd first electrode 155a bonded to the third individual electrode pad 133 through a 3rd first bump 175a and a 3rd second electrode 155b bonded to the third branch 138 of the common electrode pad 139 through a 3rd second bump 175b at the side facing the substrate 110.

All LED chips 151, 153, and 155 flip-chip bonded onto the substrate 110 and arranged in a matrix are required to have substantially the same height in order to achieve intended color reproducibility. For this purpose, all LED chips including the first LED chip 151, the second LED chip 153, and the third LED chip 155 have the same height; the 1st first electrode 151a formed at one lateral side of the first LED chip 151, the 2nd first electrode 153a formed at one lateral side of the second LED chip 153, and the 3rd first electrode 155a formed at one lateral side of the third LED chip 155 have the same height on the same imaginary straight line; and the 1st first electrode 151a formed at the other lateral side of the first LED chip 151, the 2nd first electrode 153a formed at the other lateral side of the second LED chip 153, and the 3rd first electrode 155a formed at the other lateral side of the third LED chip 155 have substantially the same height on the same imaginary straight line.

The 1st first bump 171a, the 2nd first bump 173a, and the 3rd first bump 175a have the same first height when finally compressed, and the 1st second bump 171b, the 2nd second bump 173b, and the 3rd second bump 175b have the same second height when finally compressed. The first height may be determined to be different from the second height so as to compensate for the difference in the height of the first LED chip 151, the second LED chip 153, and the third LED chip 155 stepped with each other.

The step of each of the LED chips 151, 153, and 155 may be formed by etching an epilayer structure including a laminate structure of a light transmission growth substrate (particularly, a sapphire substrate), a first conductive semiconductor layer, an active layer, and a second conductive semiconductor layer to remove some areas of the downwardly exposed second conductive semiconductor layer and the active layer adjacent thereto so that the first conductive semiconductor layer is exposed downward.

The difference in the height of the LED chips caused by etching can be reduced when the two electrodes of each LED chip are designed to have different heights, but the presence of fine steps is inevitable. For this reason, the heights of the 1st first bump 171a, the 2nd first bump 173a, and the 3rd first bump 175a when they are not compressed are made identical to the heights of the 1st second bump 171b, the 2nd second bump 173b, and the 3rd second bump 175b when they are not compressed. However, the first height of the 1st first bump 171a, the 2nd first bump 173a, and the 3rd first bump 175a when finally compressed may be made different from the heights of the 1st second bump 171b, the 2nd second bump 173b, and the 3rd second bump 175b when finally compressed so as to compensate for the steps of the LED chips taking into consideration the heights of the electrodes of the LED chips.

When compressed to the first height, the 1st first bump 171a, the 2nd first bump 173a, and the 3rd first bump 175a have bonding areas corresponding to 50-80% of the upper surface areas of the wide portions of the first individual electrode pad 131, the second individual electrode pad 132, and the third individual electrode pad 133, respectively. When finally compressed, the 1st second bump 171b, the 2nd second bump 173b, and the 3rd second bump 175b have bonding areas corresponding to 50-80% of the upper surface areas of the first branch 136, the second branch 137, and the third branch 138, respectively.

When the bump 171a, 173a, 175a, 171b, 173b or 175b has a bonding area corresponding to 50-80% of the upper surface area of the corresponding individual electrode pad or the corresponding branch of the common electrode pad, the bump is prevented from coming into contact with the adjacent bump, which reduces the danger of shorting. That is to say, also in the case where the bonding area of the bump 171a, 173a, 175a, 171b, 173b or 175b is predetermined, there is a possibility that the bump may be inclined to the adjacent bump by very small distortion or slipping in a practical process. In contrast, when the bonding area of the bump 171a, 173a, 175a, 171b, 173b or 175b is limited to ≤80% defined above, the bump does not come into contact with the adjacent bump, which prevents the occurrence of shorting caused by slipping or distortion in a practical process. If the bonding area is <50%, reliable bonding is not ensured. Accordingly, the area where the bump is finally bonded to the corresponding electrode pad or branch is preferably limited to at least 50%.

The first branch 136, the second branch 137, and the third branch 138 are portions of the common electrode pad and define the bonding areas of the 1st second bump 171b, the 2nd second bump 173b, and the 3rd second bump 175b, respectively, to fundamentally prevent the occurrence of shorting caused by distortion or slipping of the 1st second bump 171b, the 2nd second bump 173b, and the 3rd second bump 175b during flip-chip bonding. In other words, without the first, second, and third branches 136, 137, and 138 separated from each other by the recesses at one side of the common electrode pad 139, the 1st second bump 171b, the 2nd second bump 173b or the 3rd second bump 175b may slip or may be distorted on the common electrode pad during flip-chip bonding, causing problems such as shorting. In contrast, when the first, second, and third branches 136, 137, and 138 are provided, the 1st second bump 171b, the 2nd second bump 173b, and the 3rd second bump 175b slip or are distorted within the limited areas on the common electrode pad, thus preventing problems such as shorting.

The plurality of LED chips 151, 153, and 155 flip-chip bonded to the substrate 110 are grouped into a plurality of groups of LED chips 150 arranged in a matrix. Each of the groups of LED chips 150 consists of the first LED chip 151, the second LED chip 153, and the third LED chip 155 arranged at uniform intervals along the lengthwise direction. The 1st first electrode 151a, the 2nd first electrode 153a, and the 3rd first electrode 155a are electrically connected to the first, second, and third individual electrode pads 131, 132, and 133, respectively, and the 1st second electrode 151b, the 2nd second electrode 153b, and the 3rd second electrode 155b are electrically connected to the common electrode pad 139. This electrical connection enables individual control of the first LED chip 151, the second LED chip 153, and the third LED chip 155 belonging to each LED chip group 150.

The LED chip groups 150 arranged in a matrix on the substrate 110 have the same intervals in the widthwise and lengthwise directions. In addition, the intervals of the LED chip groups 150 in the widthwise direction are identical to those in the lengthwise direction. To this end, the electrode patterns 130 arranged in a matrix on the substrate 110 are designed to have the same intervals in the widthwise and lengthwise so as to correspond to the LED chips. In addition, the intervals of the electrode patterns 130 in the widthwise direction are preferably designed to be identical to those in the lengthwise direction.

The interval between the first LED chip 151 and the second LED chip 153 is the same as that between the second LED chip 153 and the third LED chip 155 and is preferably from 0.3 to 1.5 mm. For example, the chips may be designed to have intervals of approximately 0.75 mm for an FHD LED module and 0.375 mm for a UHD LED module.

Figure 10:
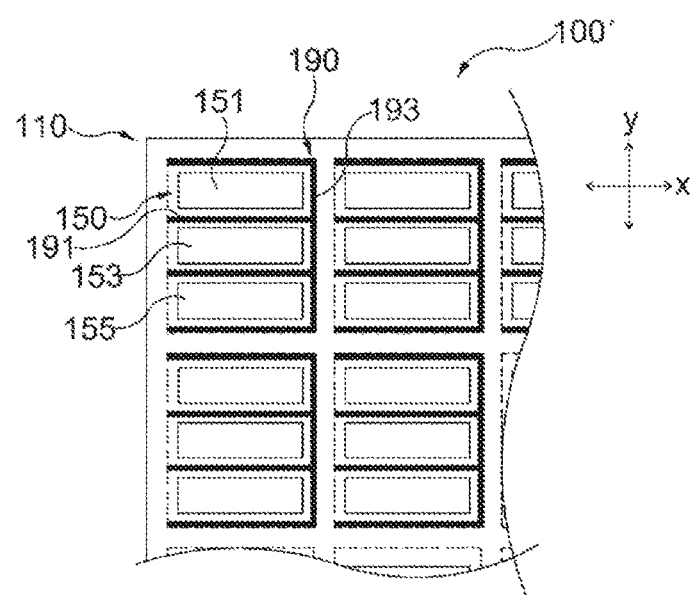
FIG. 10 is a plan view for explaining an alternative embodiment of the LED module illustrated in FIGS. 7 to 9.

Referring now to FIG. 10, an LED module further including additional elements compared to the foregoing embodiments will be explained.

FIG. 10 illustrates an LED module 100' including a barrier 190 formed on the substrate 110 to prevent light interference between the adjacent LED chips 151, 153, and 155 in each LED chip group 150. In this embodiment, the barrier 190 includes first light reflective walls 191 formed between the adjacent first and second LED chips 151 and 153 and between the adjacent second and third LED chips 155 and second light reflective walls 193 formed between the LED chip groups 150 adjacent to each other in the lengthwise direction and between the LED chip groups 150 adjacent to each other in the widthwise direction.

The first light reflective walls 191 and the second light reflective walls 193 can prevent the interference of light from the adjacent LED chips in the LED chip group 150 and the interference of light from the adjacent LED chips of the adjacent two LED chip groups 150, respectively. This interference causes loss of quality of light from the LED chips. Instead of the barrier 190 including the light reflective walls, barriers capable of absorbing light from the LED chips may be formed between the LED chips 151, 153, and 155 or between the LED chip groups 150 to prevent the interference of light from the LED chips.

Figure 11:
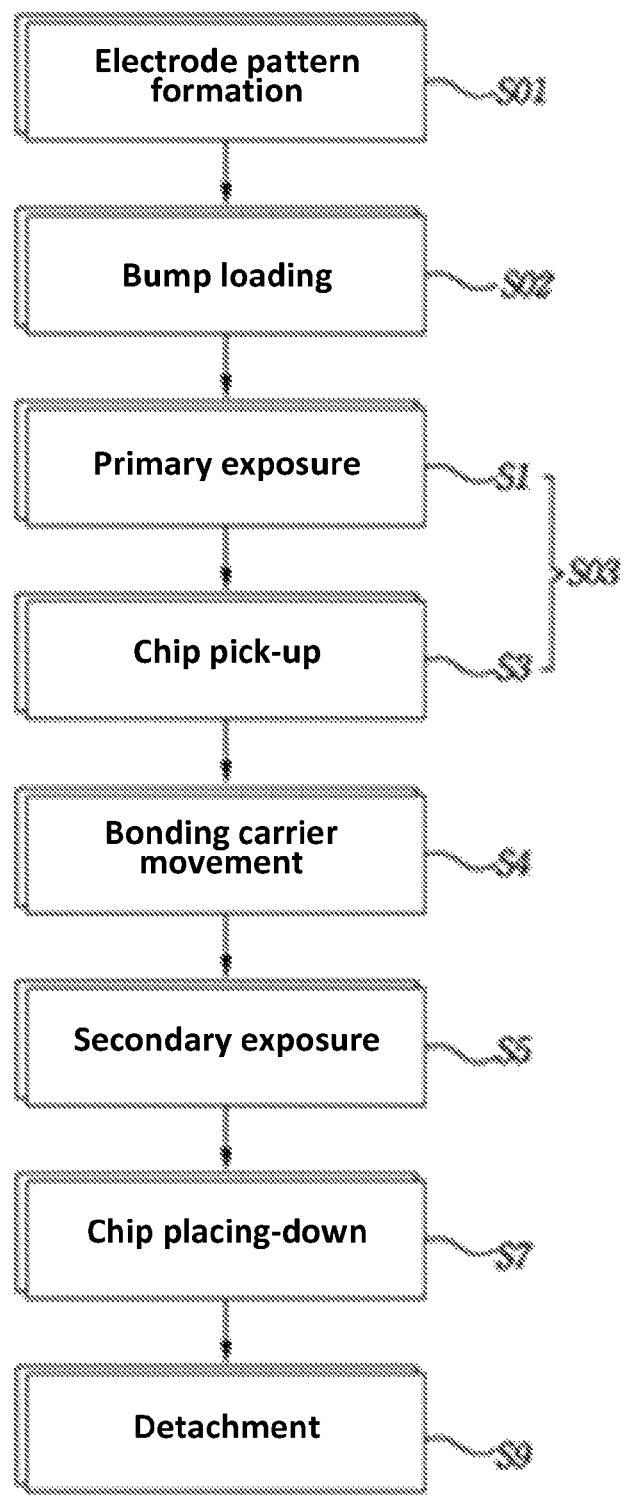
FIG. 11 is a flow chart for explaining a method for fabricating the LED module illustrated in FIGS. 7 to 10.
Figure 12:
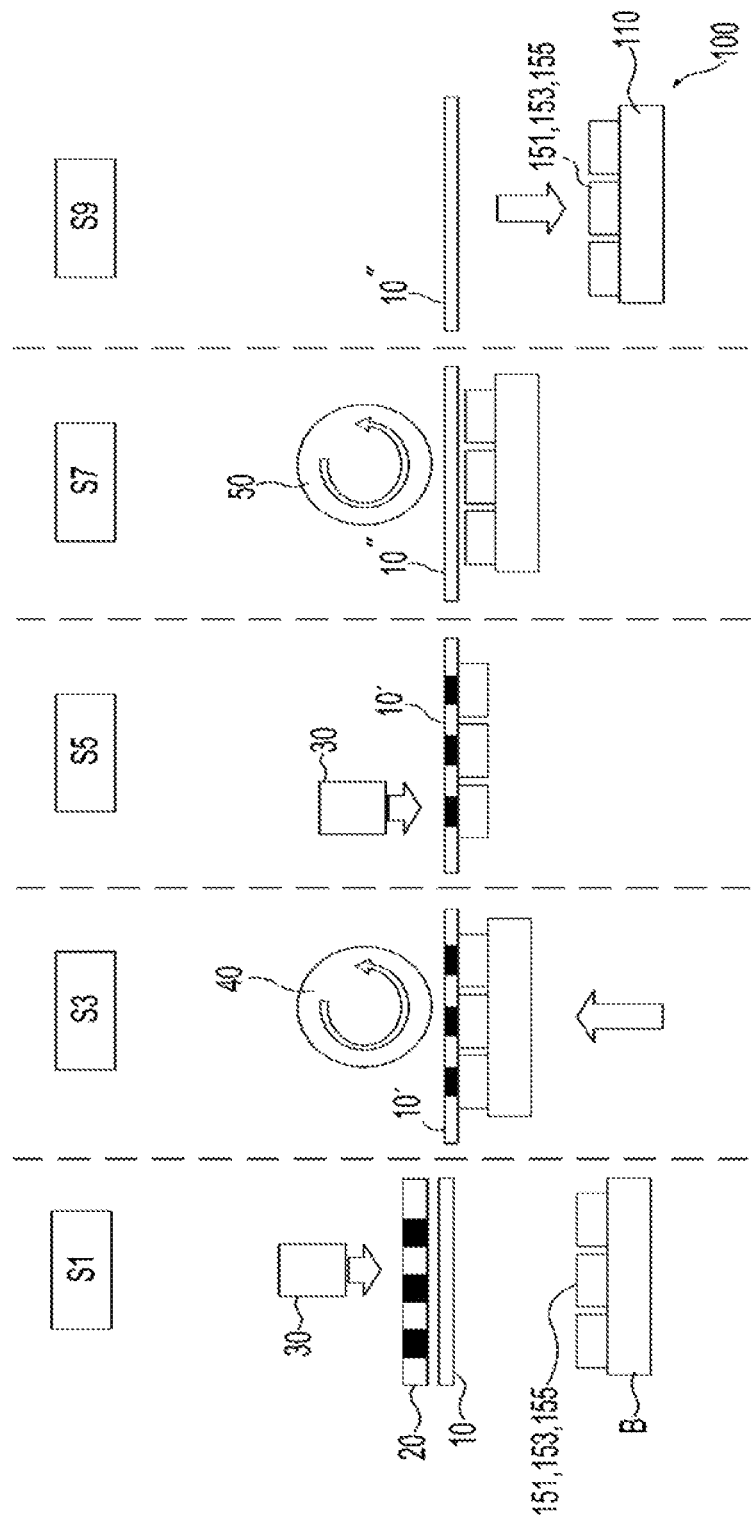
FIG. 12 illustrates a procedure for transfer printing of LED chips on a substrate for the fabrication of the LED module illustrated in FIGS. 7 to 10.

Referring to FIGS. 11 and 12, an explanation will be given regarding a method for fabricating the LED module illustrated in FIGS. 7 to 9.

Referring to FIGS. 7, 8, 9, 11, and 12, a method for fabricating the LED module according to the present invention includes: forming the electrode patterns 130, each of which includes the first individual electrode pad 131, the second individual electrode pad 132, the third individual electrode pad 133, and the common electrode pad 139, in a matrix on the substrate 110, as illustrated in FIG. 7 (S01); loading the 1st first bumps 171a, the 2nd first bumps 173a, and the 3rd first bumps 175a on the first individual electrode pads 131, the second individual electrode pads 132, and the third individual electrode pads 133, respectively, and loading the 1st second bumps 171b, the 2nd second bumps 173b, and the 3rd second bumps 175b on the first branches 136, the second branches 137, and the third branches 138 of the common electrode pads 139, respectively, as illustrated in FIG. 8 (S02); and collectively mounting the plurality of LED chips including the first, second, and third LED chips 151, 153, and 155 having different wavelength characteristics to predetermined heights on the substrate 110 such that the groups of LED chips 150 are arranged in a matrix on the substrate 110, as illustrated in FIG. 11 (S03).

Particularly, the step of arranging the groups of LED chips 150 in a matrix on the substrate 110 (S03) includes transferring the plurality of LED chips 151, 153, and 155 arranged in a predetermined matrix to a support B by a roll-to-roll transfer printing technique and mounting the LED chips without changing their original matrix on the substrate 110.

As explained in detail below, the roll-to-roll transfer printing technique for the transfer of the LED chips 151, 153, and 155 uses a bonding carrier, a pick-up roll 40 adapted to pressurize the bonding carrier at the time when the LED chips 151, 153, and 155 are picked up, and a chip placing roll 50 adapted to pressurize the LED chips 151, 153, and 155 at the time when the LED chips 151, 153, and 155 are mounted on the substrate 110. The pick-up roll 40 and the chip placing roll 50 operate in cooperation with each other against the bonding carrier at chip pick-up and chip mounting positions so that the LED chips 151, 153, and 155 can be transferred to and mounted on the substrate 110 from the support B without changing their original matrix. The bonding carrier is an element that is adhesive enough to bond and carry the plurality of LED chips 151, 153, and 155. The pick-up roll 40 is an element adapted to pressurize the bonding carrier against the LED chips such that the LED chips located on the support B are bonded to the bonding carrier. The chip placing roll 50 is an element adapted to pressurize the plurality of LED chips 151, 153, and 155 against the substrate 110 without changing their original matrix bonded to the bonding carrier. In addition to these elements, additional means may be used to partially weaken the adhesive strength of the bonding carrier before pick-up of the LED chips using the pick-up roll 40 or to weaken the adhesive strength of the bonding carrier as a whole before mounting of the LED chips 151, 153, and 155 on the substrate 110 using the chip placing roll 50.

As briefly mentioned above, the step of arranging the groups of LED chips 150 in a matrix on the substrate 110 (S03) includes: bonding the LED chips including the first LED chips 151 having the 1st first electrodes 151a and the 1st second electrodes 151b, the second LED chips 153 having the 2nd first electrodes 153a and the 2nd second electrodes 153b, and the third LED chips 155 having the 3rd first electrodes 155a and the 3rd second electrodes 155b in a matrix to a bonding carrier 10' having some areas whose adhesive strength is weakened (S1, S3); moving the bonding carrier such that the 1st first electrodes 151a, the 2nd first electrodes 153a, and the 3rd first electrodes 155a face the 1st first bumps 171a, the 2nd first bumps 173a, and the 3rd first bumps 175a, respectively, and the 1st second electrodes 151b, the 2nd second electrodes 153b, and the 3rd second electrodes 155b face the 1st second bumps 171b, the 2nd second bumps 173b, and the 3rd second bumps 175b, respectively (S4); and pressurizing the first LED chips 151, the second LED chips 153, and the third LED chips 155 to a predetermined pressure such that the 1st second bumps 171b, the 2nd second bumps 173b, and the 3rd second bumps 175b are compressed to a first height and the 1st second bumps 171b, the 2nd second bumps 173b, and the 3rd second bumps 175b are compressed to a second height (chip placing down, S7).

The steps of bonding the LED chips in a matrix (S1 and S3) include primarily exposing the bonding carrier 10 to produce a bonding carrier 10' consisting of areas whose adhesive strength is weakened and areas whose adhesive strength remains unweakened (S1) and pressurizing the areas whose adhesive strength remains unweakened against the LED chips 151, 153, and 155 using a rolling pick-up roll 40 to bond the LED chips 151, 153, and 155 to the bonding carrier 10' (S3).

First, before the LED chips 151, 153, and 155 are attached in a matrix to the bonding carrier, the LED chips 151, 153, and 155 are arranged in a matrix on the support B. Here, the LED chips arranged in a matrix have the same intervals in the widthwise intervals and lengthwise directions as a matrix of the LED chips 151, 153, and 155 to be attached to the bonding carrier 10' having areas whose adhesive strength is weakened and a matrix of the LED chips 151, 153, and 155 to be mounted on the substrate 110 in the subsequent processes. Before attachment of the LED chips 151, 153, and 155 in a matrix to the bonding carrier 10, no treatment is carried out to weaken the adhesive strength of the bonding carrier 10. The bonding carrier 10 is located on the LED chips 151, 153, and 155, and a photomask 20 and an exposure device 30 for primary exposure of the bonding carrier 10 may be arranged on the bonding carrier 10.

It is necessary to weaken the adhesive strength of areas of the bonding carrier 10 that do not correspond to the LED chips 151, 153, and 155. To this end, in S1, UV light from the exposure device 30 is irradiated only onto areas of the bonding carrier not corresponding to the LED chips 151, 153, and 155 through through-holes of the photomask 20. The UV light acts on the bonding carrier 10 at a constant temperature of 200° C. or less to weaken the adhesive strength of some areas of the bonding carrier 10. As a result, areas whose adhesive strength is weakened are intermittently formed in the bonding carrier 10'.

In S3, the LED chips 151, 153, and 155 are attached to the areas of the bonding carrier 10 whose adhesive strength remains unweakened. The pick-up roll 40 arranged on the bonding carrier 10' having the areas whose adhesive strength is weakened pressurizes the bonding carrier 10' against the LED chips 151, 153, and 155. At this time, each of the bonding carrier 10' and the support B is maintained fixed and the pick-up roll 40 rolls to sequentially pressurize all areas of the bonding carrier 10' against the LED chips 151, 153, and 155. By the movement of the pick-up roll 40, the LED chips 151, 153, and 155 can be prevented from slipping off their set positions relative to the bonding carrier 10' and being adsorbed to the bonding carrier 10'.

It is preferred to secondarily expose the bonding carrier 10' just before S7. When secondarily exposed, the bonding carrier 10' having some areas whose adhesive strength is weakened is converted into a bonding carrier 10" whose adhesive strength is weakened as a whole. In S7, the chip placing roll 50 pressurizes the LED chips 151, 153, and 155 to a predetermined pressure while rolling on the bonding carrier 10" whose adhesive strength is weakened as a whole. Subsequently, the bonding carrier 10" whose adhesive strength is weakened as a whole is detached from the LED chips 151, 153, and 155 (S9).

The pressurization by the rolling of the chip placing roll 50 allows the LED chips 151, 153, and 155 bonded to the bonding carrier 10" to be sequentially attached to the substrate 110. Here, the bumps can be heated above a predetermined temperature. By the rolling placing roll 50, the LED chips 151, 153, and 155 are reliably mounted at predetermined heights and intervals at set positions of the substrate 110.

According to this method, the LED chips 151, 153, and 155 can be mounted on the substrate 110 in a short time. In addition, the mounted LED chips 151, 153, and 155 emitting light at different wavelengths can be grouped to correspond to pixels. These groups can be arranged in a matrix to fabricate the LED module. The LED chips arranged in a matrix are collectively bonded to the bonding carrier and are then transferred to and mounted on the substrate 110 without changing their original matrix, enabling precise control over the alignment and interval of the LED chips 151, 153, and 155.

The LED module having arrays of the LED chips emitting light at different wavelengths is not limited to the constitutional and operational modes of the foregoing embodiments. All or some of the embodiments are selectively combined for various modifications.

[Fabrication of Third Type LED Module]

Figure 13:
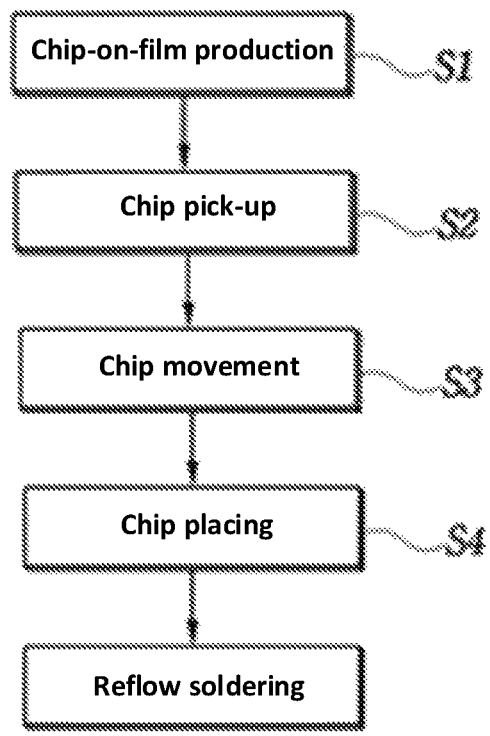
FIG. 13 is a flow chart for explaining a method for fabricating an LED module by using selective transfer printing according to another embodiment of the present invention.

Referring to FIG. 13, a method for fabricating an LED module includes producing a chip-on-film including an adhesive chip retaining film and a plurality of LED chips bonded onto the chip retaining film (S1), transferring the LED chips from the adhesive chip retaining film to a carrier tape (chip pick-up, S2), moving the carrier tape to move the LED chips (S3), and transferring the LED chips from the carrier tape to a substrate (particularly, a circuit board or an AM substrate) (chip placing S4).

S2, S3, and S4 are sequentially carried out after feeding of LED chips into a chip array system, which will be presented hereinafter. S1 is carried out before a chip array process in the chip array system.

Figure 14:
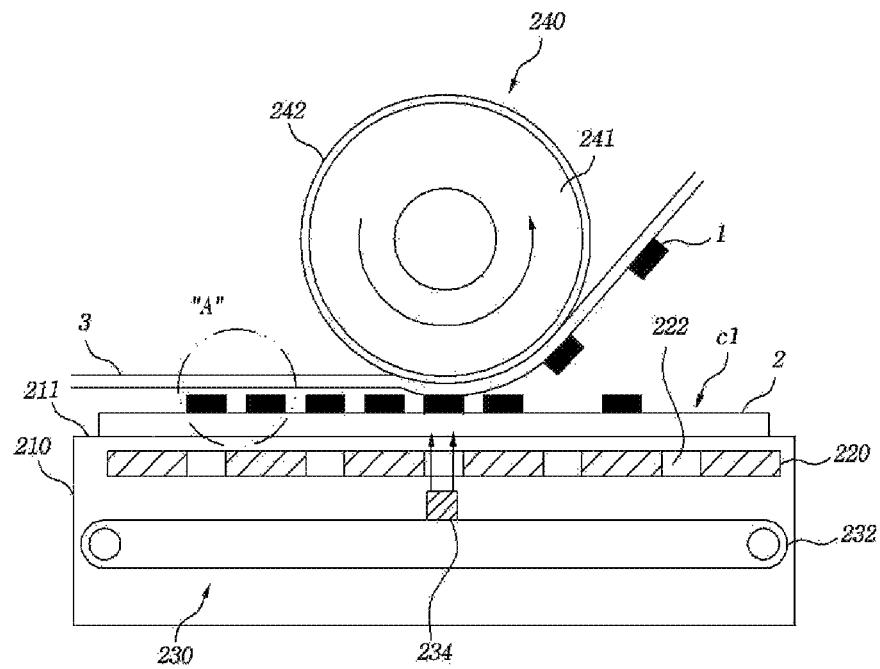
FIG. 14 illustrates the step of picking up chips in the method illustrated in FIG. 13.
Figure 15:
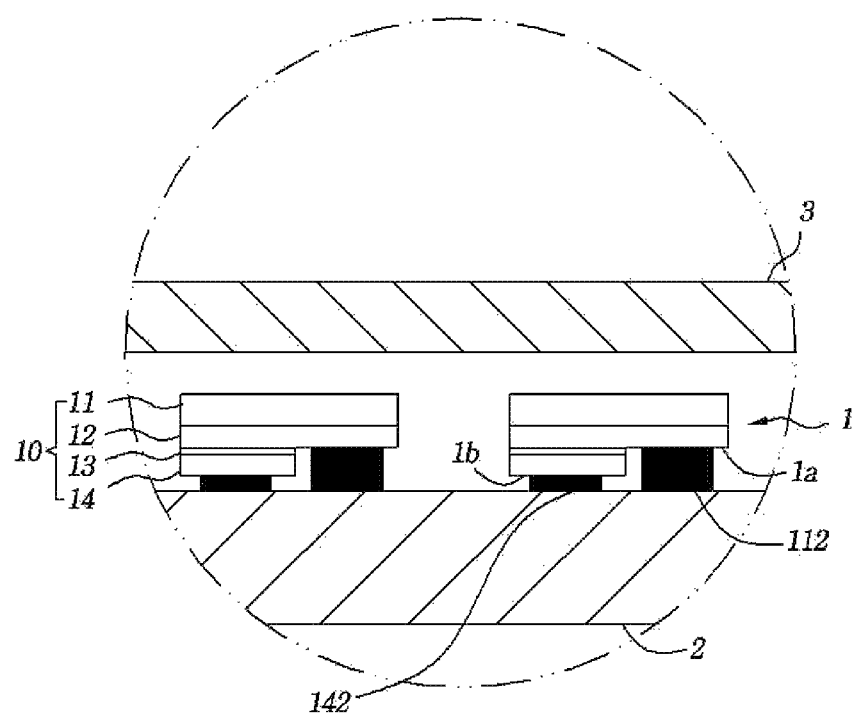
FIG. 15 is an enlarged view of circle "A" of FIG. 14.

S1 includes attaching a plurality of flip-bonded LED chips 1 onto an adhesive chip retaining film 2 in a matrix, as illustrated in FIGS. 14, and 15. Each of the LED chips 1 includes a light emitting semiconductor structure 10 having two bottom areas 1a and 1b, which have different step heights, a first conductive electrode pad 112 disposed in the area 1a, and a second conductive electrode pad 142 disposed in area 1b, respectively. The light emitting semiconductor structure 10 includes a base substrate 11, a first conductive semiconductor layer 12, an active layer 13, and a second conductive semiconductor layer 14. The base substrate 11 may be a sapphire growth substrate on which an epilayer including the first conductive semiconductor layer 12, the active layer 13, and the second conductive semiconductor layer 14 is grown. Alternatively, the base substrate 11 may be a support substrate to which epilayers are attached. The exposed areas 1a and 1b are formed on the bottom surfaces of the first conductive semiconductor layer 12 and the second conductive semiconductor layer 14, respectively. The first conductive electrode pad 112 is formed in the exposed area 1*a* on the first conductive semiconductor layer 12 and the second conductive electrode pad 142 is formed in the exposed area 1*b* on the second conductive semiconductor layer 14.

The plurality of LED chips 1 are arrayed such that the first conductive electrode pads 112 and the second conductive electrode pads 142 are directed downward and are bonded to bonding areas of the chip retaining film 2. The chip retaining film 2 is designed to lose its adhesiveness when irradiated with UV light. Due to this design, UV light irradiated onto particular areas of the chip retaining film 2 relatively weakens the adhesiveness of the particular areas.

On the other hand, S2, S3, and S4 may be sequentially carried out in a chip array system including a carrier tape 3, a pick-up stage 210, a photomask 220, a UV scan set 230 for film exposure, a pick-up roller 240, a placing roller 260, and a UV light source 250 for tape exposure, as illustrated in FIGS. 14 to 18.

Referring first to FIG. 14, in S1, a chip-on-film c1 including an adhesive chip retaining film 2 and a plurality of LED chips 1 arrayed thereon is arranged on a pick-up stage 210. Here, the pitch in the LED chip arrays on the chip retaining film 2 is determined to be different from the desired pitch in the LED chip arrays on a target substrate 5. That is to say, the ratio of the desired number of the LED chips in the LED chip arrays (i.e. the number of pairs of electrodes) on a target substrate 5 (see FIGS. 17 and 18) to the number of the LED chips in the LED chip arrays on the chip retaining film 2 is defined as 1:n (where n is a natural number equal to or greater than 1). Thus, the number of the LED chips 1 attached to the chip retaining film 2 is n times larger than the number of the LED chips 1 arranged on the substrate 5 (see FIGS. 17 and 18). Some of the LED chips 1 attached to the chip retaining film 2 can be selectively detached from the chip retaining film 2 and attached onto the substrate 5. Here, the substrate 5 may be a substrate formed with an electric circuit (more specifically, an active matrix substrate).

After the chip-on-film c1 is arranged on a UV transmitting upper plate 211 of the pick-up stage 210, the adhesive strength of areas of the chip retaining film 2 where particular LED chips 1 are attached is weakened. As a result, only the selected LED chips 1 can be picked up from the chip retaining film 2. To this end, a photomask 220 and a UV scan set 230 for film exposure are used that underlie the UV transmitting upper plate 211. A plurality of UV transmitting windows 222 are formed in the photomask 220.

The UV scan set 230 for film exposure includes a UV light source 234 for film exposure and a light source carrier 232 adapted to move the UV light source 234 to a position corresponding to a particular one of the UV light-transmitting windows 222. The UV light source 234 located under the particular UV light-transmitting window 222 irradiates UV onto a particular area of the chip retaining film 2 attached with the particular LED chip 1. This UV exposure weakens the adhesive strength of the chip retaining film 2 to the particular LED chip 1. The plurality of UV light-transmitting windows 222 may be arranged in the X-axis direction and the Y-axis direction orthogonal thereto. The light source carrier 232 may move the UV light source 234 in the X- and Y-axis directions.

The adhesive strength of the chip retaining film 2 to the selected LED chip 1 is weakened, and simultaneously, the pick-up roller 240 pressurizes the carrier tape 3 against the selected LED chip 1 to attach the selected LED chip 1 to the carrier tape 3 while rolling in one direction. The rolling of the pick-up roller 240 can be accomplished by the translation of the pick-up roller 240. Alternatively, the rolling of the pick-up roller 240 may be accomplished by the translation of the stage 200 while the pick-up roller 240 rolls in place.

The adhesive strength of one area of the chip retaining film 2 exposed to UV light is lower than that of the carrier tape 3 because the area loses its adhesive strength by UV exposure. Due to the weakened adhesive strength, the selected LED chip 1 is attached to the carrier tape 3. Although all LED chips 1 in the particular LED chip array on the chip retaining film 2 are brought into contact with the carrier tape 3 by pressurization of the rolling pick-up roller 240, the LED chips 1 in the areas of the chip retaining film 2 whose adhesive strength is weakened by UV exposure (i.e. only the selected LED chips 1) are attached to the carrier tape 3, and the other LED chips 1 (i.e. the LED chips 1 in the areas unexposed to UV light and whose adhesive strength is not weakened) remain on the chip retaining film 2. The LED chips 1 remaining on the chip retaining film 2 can be detached from the chip retaining film 2 in other subsequent repeated chip pick-up processing steps.

The pick-up roller 240 is provided with a flexible blanket 242 on the outer circumference of a roller body 241 coupled to a shaft. The provision of the blanket 242 allows the LED chips 1 to be better attached to the transfer tape 3 and protects the LED chips 1 from damage caused by pressurization.

The LED chips 1 to be picked up may be selected in such a manner that the UV light source 234, the UV light-transmitting window 222 of the photomask 220, and the area where the LED chip 1 to be picked up is attached are allowed to lie on the same imaginary vertical line through the movement of the UV light source 234 in the X- or Y-axis direction by the light source carrier 232. Thus, the pitch of the LED chips 1 in the particular LED chip array on the chip retaining film 2 is different from that of pairs of electrodes on the substrate mounted with the LED chips, and as a result, the ratio of the number of the LED chips in the particular LED chip array on the chip retaining film 2 to the number of pairs of electrodes on the substrate (i.e. the desired number of the LED chips in the LED chip array on the substrate) is n:1. In this case, the pick-up and placing down may be repeated n times.

Figure 16:
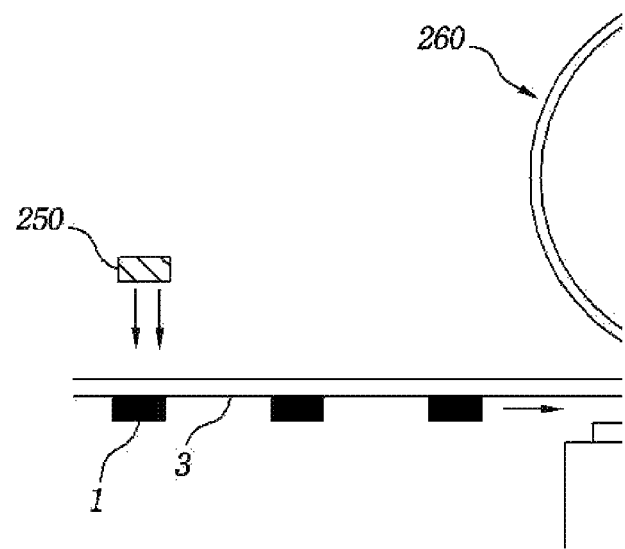
FIG. 16 illustrates the step of moving chips and the step of weakening the adhesive strength of a carrier tape just before placing of the chips in the method illustrated in FIG. 15.

Referring next to FIG. 16, the carrier tape on which the LED chips 1 are picked up is moved in one direction to move the chips (S3). The carrier tape 3 has a predetermined adhesive strength to the LED chips 1. The carrier tape 3 together with the LED chips 1 attached and held thereon is moved by suitable moving means, for example, a feeding roller and a guiding roller. The UV light source 250 may be arranged in the middle of the flow path of the carrier tape 3 or around the placing roller 260. The UV light source 250 irradiates UV light onto the carrier tape 3 to weaken the adhesive strength of the carrier tape 3 as a whole.

Figure 17:
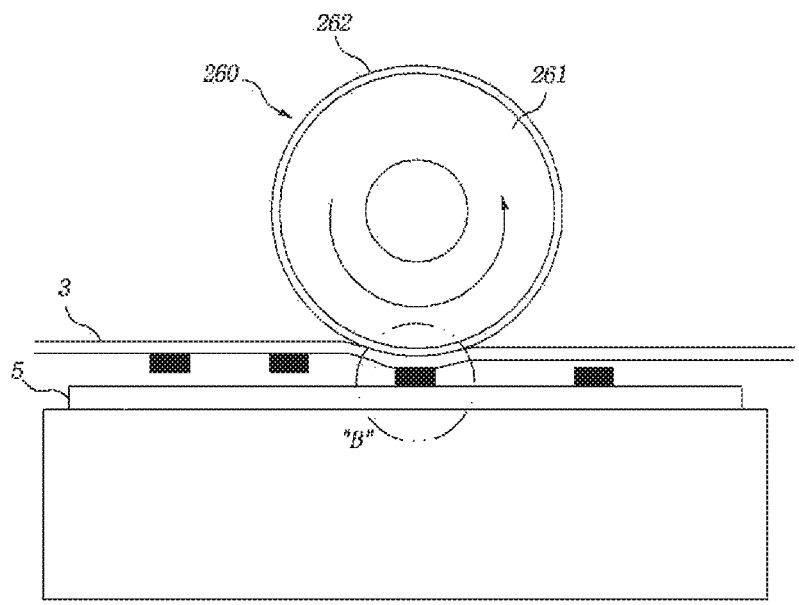
FIG. 17 illustrates the step of placing chips in the method illustrated in FIG. 16.
Figure 18:
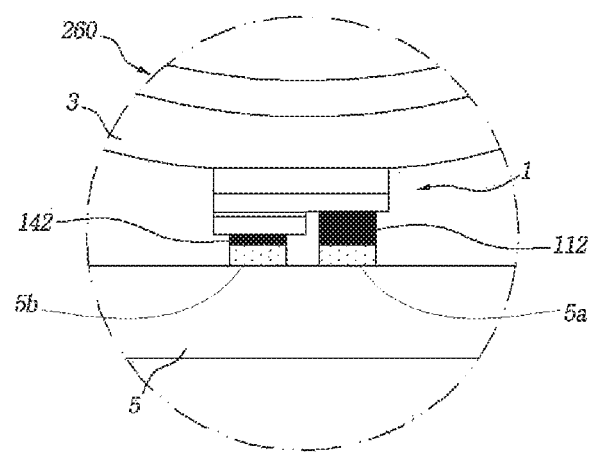
FIG. 18 is an enlarged view of circle "B" of FIG. 17.

Referring to FIGS. 17 and 18, one area of the carrier tape 3 attached with the LED chips 1 is moved between the placing roller 260 and the substrate 5 formed with pairs of bumps 5*a* and 5*b*. Here, the adhesive strength of the carrier tape 3 exposed to UV light is lower than that of an adhesive loaded on the substrate 5, more specifically on the pairs of bumps 5*a* and 5*b*. The placing roller 260 rolls and pressurizes the LED chips 1 attached to the carrier tape 3 against the substrate 5, more specifically against the pairs of bumps 5*a* and 5*b* on the substrate 5, to attach the corresponding LED chips 1 onto the substrate 5. The placing roller 260 may be provided with a flexible blanket 262 on the outer circumference of a roller body 261 coupled to a shaft. The provision of the blanket allows the LED chips 1 to be better placed down during rolling and can protect the LED chips 1 from damage caused by pressurization during rolling. The LED chips 1 placed down on the substrate 5 can be bonded onto the substrate 5 by a reflow soldering process.

Figure 19:
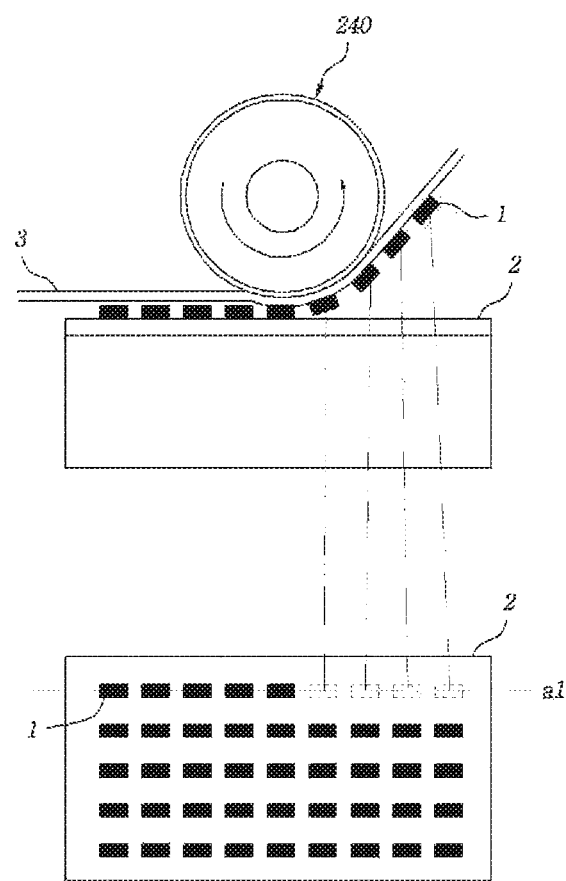
FIG. 19 illustrates a process for picking up LED chips by total transfer printing.
Figure 20A:
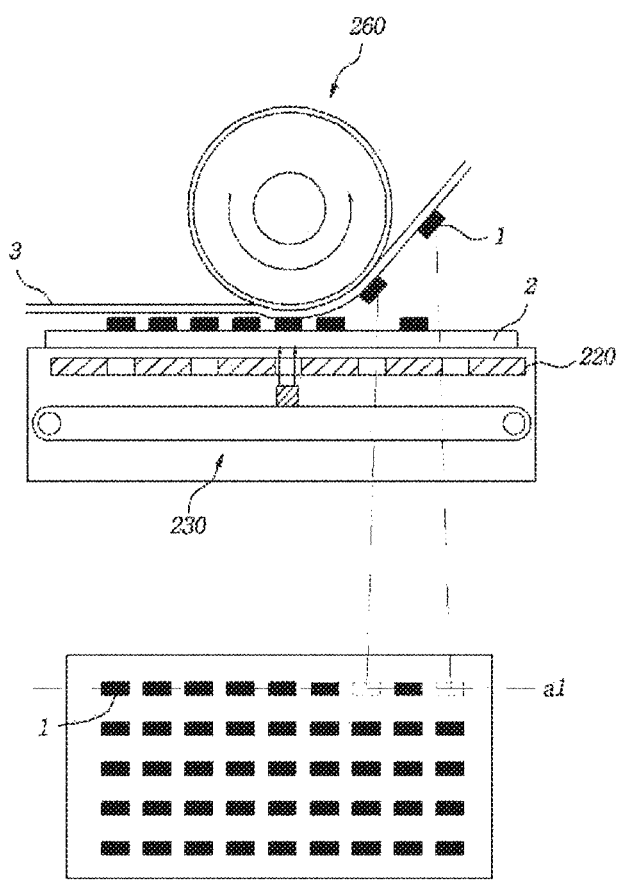
FIGS. 20a and 20b illustrate several exemplary processes for picking up LED chips by selective transfer printing.
Figure 20B:
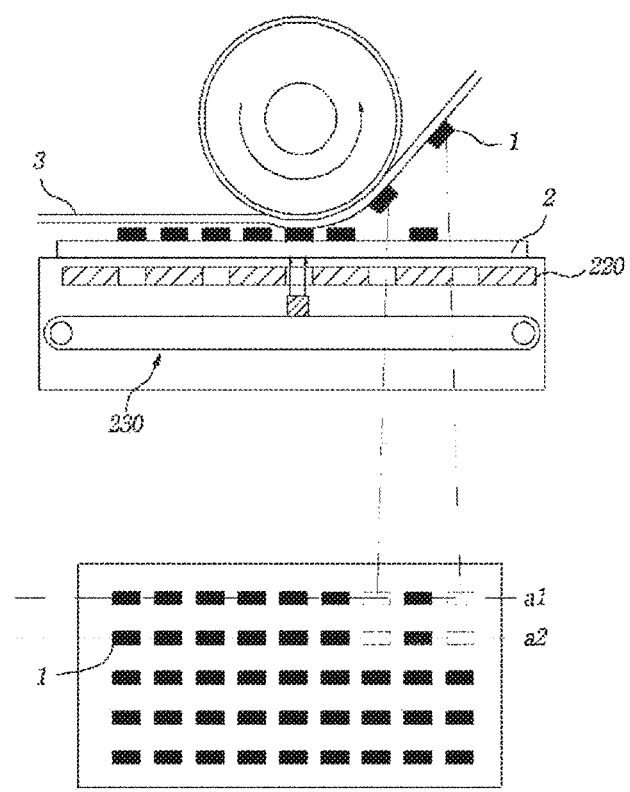

FIGS. 19, 20a, and 20b compare the pick-up of LED chips by total transfer with the pick-up of LED chips by selective transfer.

Referring to FIG. 19, according to the pick-up of LED chips by total transfer, the pick-up roller 240 sequentially pressurizes all LED chips 1 in the corresponding array a1 on the chip retaining film 2, and as a result, the LED chips 1 are transferred and attached without omission to the carrier tape 3. In this case, the pitch of the LED chips 1 in the corresponding array a1 on the chip retaining film 2 is the same as the pitch in the array on the substrate to which the LED chips 1 are to be transferred, and the ratio of the number of the LED chips arrayed on the chip retaining film 2 to the number of the LED chips arrayed on the substrate is 1:1.

In contrast, referring to FIGS. 20a and 20b, according to the pick-up of LED chips by selective transfer, the placing roller 260 pressurizes all LED chips 1 in the corresponding array a1 during rolling but only the LED chips 1 in the areas of the chip retaining film 2 whose adhesive strength is weakened using the UV scan set 230 and the photomask 220 are picked up on the carrier tape 3. As illustrated in FIG. 20a, a one-time pick-up operation can also be performed to pick up the LED chips 1 in one array a1. As illustrated in FIG. 20b, a one-time pick-up operation may also be performed to simultaneously pick up the LED chips 1 in two or more arrays a1 and a2. Although illustrated, the present invention can be advantageously used for selective pick-up of the LED chips 1 attached to the chip retaining film 2 in a complex pattern as well as in a matrix.

What is claimed is:

1. A display module comprising:
   a substrate;
   a plurality of electrode patterns having a predetermined height arranged in a matrix on the substrate; and
   a plurality of groups of LED chips arranged in a matrix on the substrate so as to have the same height as a whole and correspond to the electrode patterns,
   wherein:
   each of the electrode patterns comprises a common electrode pad aligned to a first end line parallel to the lengthwise direction of the matrix, and a first individual electrode pad, a second individual electrode pad, and a third individual electrode pad aligned to a second end line parallel to the first end line and located between the first end line and the second end line;
   each of the groups of LED chips comprises a first LED chip, a second LED chip, and a third LED chip arrayed in a line along the lengthwise direction and emitting light at different wavelengths when power is applied thereto;
   each of the first LED chip, the second LED chip, and the third LED chip has an epilayer structure comprising a laminate structure of a light transmission growth substrate, a first conductive semiconductor layer, an active layer, and a second conductive semiconductor layer and has a first area where the second conductive semiconductor layer is exposed and a second area where the first conductive semiconductor layer is exposed;
   the first LED chip has a 1st first electrode bonded to the first individual electrode pad through a 1st first bump formed on the first area and a 1st second electrode bonded to the common electrode pad through a 1st second bump formed on the second area at the side facing the substrate;
   the second LED chip has a 2nd first electrode bonded to the second individual electrode pad through a 2nd first bump formed on the first area and a 2nd second electrode bonded to the common electrode pad through a 2nd second bump formed on the second area at the side facing the substrate;
   the third LED chip has a 3rd first electrode bonded to the third individual electrode pad through a 3rd first bump formed on the first area and a 3rd second electrode bonded to the common electrode pad through a 3rd second bump formed on the second area at the side facing the substrate; and
   the first area of the first LED chip, the first area of the second LED chip, and the first area of the third LED chip have the same height, the second area of the first LED chip, the second area of the second LED chip, and the second area of the third LED chip have the same height, the 1st first bump, the 2nd first bump, and the 3rd first bump have the same first height when finally compressed, the 1st second bump, the 2nd second bump, and the 3rd second bump have the same second height when finally compressed, and the first height and the second height are determined so as to compensate for different heights of the first LED chip, the second LED chip, and the third LED chip due to the step height between the first areas and the second areas.

2. The display module according to claim 1, wherein the first individual electrode pad, the second individual electrode pad, and the third individual electrode pad are parallel to the first end line and comprise a first end, a second end, and a third end located adjacent to the first end line, respectively.

3. The display module according to claim 1, wherein the common electrode pad comprises recesses depressed inwardly from the first end line and a first branch, a second branch, and a third branch, whose shapes are defined by the recesses, the 1st second bump is bonded to the upper surface of the first branch and has a smaller bonding area than the upper surface area of the first branch, the 2nd second bump is bonded to the upper surface of the second branch and has a smaller bonding area than the upper surface area of the second branch, and the 3rd second bump is bonded to the upper surface of the third branch and has a smaller bonding area than the upper surface area of the third branch.

4. The display module according to claim 1, wherein the first individual electrode pad, the second individual electrode pad, and the third individual electrode pad comprise wide portions to which the 1st first bump, the 2nd first bump, and the 3rd first bump are bonded, respectively, and narrow portions having smaller widths than the wide portions and adjacent to the second end line.

5. The display module according to claim 4, wherein each of the 1st first bump, the 2nd first bump, and the 3rd first bump has a bonding area corresponding to 50-80% of the upper surface area of the corresponding wide portion when compressed to the first height.

6. The display module according to claim 3, wherein the 1st second bump, the 2nd second bump, and the 3rd second bump have bonding areas corresponding to 50-80% of the upper surface areas of the first branch, the second branch, and the third branch, respectively, when compressed to the second height.

7. The display module according to claim 1, further comprising a barrier formed on the substrate to prevent light interference between the adjacent LED chips.

8. The display module according to claim 7, wherein the barrier comprises light reflective walls formed between the first and second LED chips and between the second and third LED chips.

9. The display module according to claim 8, wherein the barrier comprises light reflective walls formed between the adjacent LED chip groups.

10. The display module according to claim 1, wherein the substrate is made of a flexible material.

* * * * *